United States Patent [19]
Pomerantz et al.

[11] Patent Number: 5,263,130
[45] Date of Patent: Nov. 16, 1993

[54] THREE DIMENSIONAL MODELLING APPARATUS

[75] Inventors: Itzchak Pomerantz, Kefar Sava; Shalev Gilad, Hod Hasharon; Yehoshua Dollberg, Tel Aviv; Barry Ben-Ezra, Ramat Hasharon; Yehoshua Sheinman, Tel Aviv; Gill Barequet, Herzlia; Michael Nagler, Tel Aviv; Avigdor Bieber, Ra'anana; Mathew Katz, Haifa, all of Israel

[73] Assignee: Cubital Ltd., Ra'anana, Israel

[21] Appl. No.: 661,528

[22] Filed: Feb. 25, 1991

Related U.S. Application Data

[63] Continuation of Ser. No. 290,318, Dec. 22, 1988, Pat. No. 5,021,720, which is a continuation-in-part of Ser. No. 57,366, Jun. 2, 1987, Pat. No. 4,961,154.

[30] Foreign Application Priority Data

Dec. 23, 1987 [IL] Israel .......................................... 84936

[51] Int. Cl.$^5$ .................. G06F 15/00; G06K 9/00; B28B 17/00
[52] U.S. Cl. ..................... 395/118; 364/468; 364/472; 264/22; 264/183; 425/162
[58] Field of Search ............... 364/518, 521, 522, 468, 364/476, 472; 425/174, 162; 264/22, 183; 395/118, 119, 120

[56] References Cited

U.S. PATENT DOCUMENTS

| | | | |
|---|---|---|---|
| 3,428,503 | 2/1969 | Berkerle | 156/11 |
| 4,404,684 | 9/1983 | Takada | 382/25 |

Primary Examiner—Phu K. Nguyen
Attorney, Agent, or Firm—Abelman Frayne & Schwab

[57] ABSTRACT

A system responsive to coordinate information for automatically providing a three-dimensional physical model of a desired geometry and comprising apparatus for selectably solidifying a solidifiable material on a sequential layer by layer basis characterized in that following selectable solidification of a given layer, the non-solidified portions thereof are removed and replaced by a removable support material which is not solidifiable under the same conditions as the solidifiable material.

27 Claims, 18 Drawing Sheets

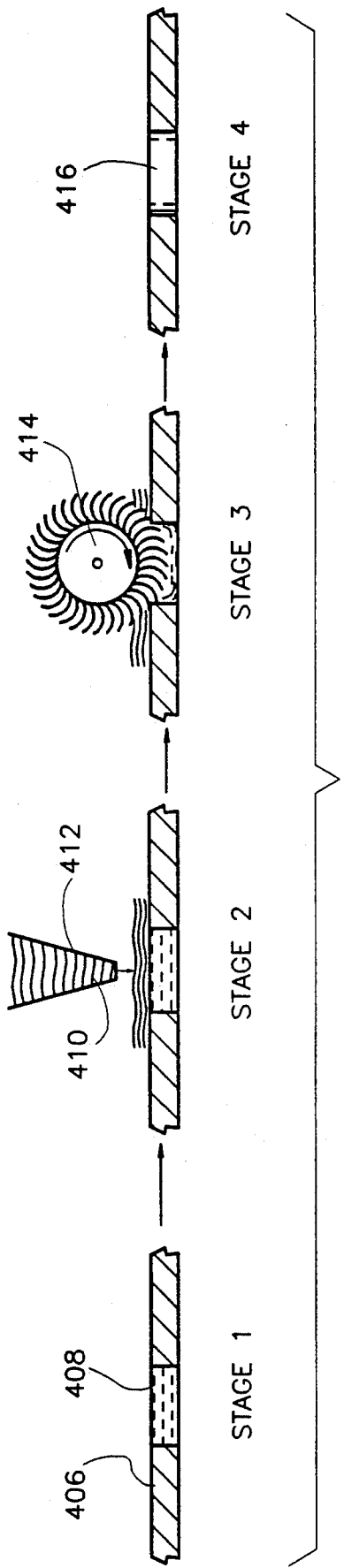
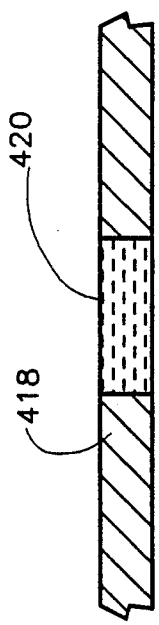
FIG. 12
FIG. 13A
FIG. 13B
FIG. 13C

THREE DIMENSIONAL MODELLING APPARATUS

This is continuation of application Ser. No. 290,318 filed on Dec. 22, 1988, now U.S. Pat. No. 5,021,720 which is a continuation-in-part Continuation of Ser. No. 057,366 filed Jun. 2, 1987 now U.S. Pat. No. 5,021,720.

FIELD OF THE INVENTION

The present invention relates to apparatus for three-dimensional modeling generally and more particularly to apparatus for three-dimensional modeling in response to a computer output.

BACKGROUND OF THE INVENTION

Various systems for three dimensional modeling have been proposed. There is described in U.S. Pat. No. 4,575,330 to Hull, apparatus for production of three-dimensional objects by stereolithography. The system described therein is intended to produce a three-dimensional object from a fluid medium capable of solidification when subjected to prescribed synergistic stimulation and comprises apparatus for drawing upon and forming successive cross-sectional laminae of the object at a two-dimensional interface and apparatus for moving the cross-sections as they are formed and building up the object in step wise fashion, whereby a three-dimensional object is extracted from a substantially two-dimensional surface.

An earlier publication by Hideo Kodama entitled "Automatic method for fabricating a three-dimensional plastic model with photo-hardening polymer", Rev. Sci. Instrum. 52(11) Nov., 1981, pp. 1770–1773 describes many of the features appearing in the Hull Patent as well as additional features.

An article by Alan J. Herbert entitled "Solid Object Generation" in Journal of Applied Photographic Engineering 8: 185–188 (1982) describes the design of apparatus for producing a replica of a solid object using a photopolymer.

FIG. 5 of the Hull Patent and FIGS. 1A and 1B of the Kodama article illustrate layer by layer buildup of a model through radiation applied to a solidifiable liquid through a mask using a "contact print" technique. Accordingly, the pattern mask for each layer must be in a 1:1 scale relationship with the object to be generated and must be located extremely close to it.

A number of difficulties are involved in the use of a contact print technique due to the required 1:1 scale. If a complex object having a typical size of up to 10 inches on each side is contemplated and resolution of 100 microns is desired, approximately 2500 masks will be required, covering an area of over 150 sq. meters. An extremely fast mechanism for moving and positioning the masks and the use of non-standard film of a given size for a given scale output would be required.

The required proximity of the mask to the object in contact print exposure is not believed to be desirable in an industrial environment because of anticipated contact between the mask and the solidifiable liquid due to vibrations in the liquid during positioning and movement of the masks and due to spurious impacts.

Neither Kodama nor Hull provides apparatus for accurate positioning of the mask and accurate registration of masks for different layers. The positioning error must not exceed the desired resolution, typically 100 microns.

Both Kodama and the Hull patent employ an arrangement whereby the object is built up onto a base which lies in a container of solidifiable liquid and moves with respect thereto. Such an arrangement involves placing a base displacement mechanism in the container and in contact with the solidifiable liquid. Due to the high viscosity and glue-like nature of such liquids, it is believed to be impractical to operate such a system when it is desired to change materials in order to vary the mechanical properties or color of the object being generated. Neither Hull nor Kodama are suitable for use with highly viscous liquids.

Furthermore, should excessive radiation be applied to the liquid, the entire volume might solidify, thus encasing the support mechanism therein.

Definition of the bottom limit of solidification for a given layer is achieved in the Hull and Kodama references by precise control of irradiation energy levels. Due to the fact that energy intensity decreases exponentially with depth within the liquid, this technique does not provide a sharp definition in layer thickness, as noted by Hull on pages 9 and 10, referring to FIG. 4. Hull suggests solving the problem of bottom limit definition by using an upwardly facing radiation technique which is not applicable to many geometrical configurations.

The prior art exemplified by the Kodama and Hull references does not provide teaching of how to model various geometries which involve difficulties, for example a closed internal cavity, such as a hollow ball, isolated parts, such as a linked chain, and vertically concave shapes, such as a simple water tap. The identification of situations which require the generation of support structures and the automatic generation of such structures are not suggested or obvious from the prior art. Neither Kodama nor Hull contain suggestions for maximizing utilization of the available model generation volume.

An additional difficulty involved in prior art modeling techniques of the type exemplified by the Kodama and Hull references, but which is not explicitly considered by either is shrinkage of the solidifiable liquid during solidification. Normal shrinkage for most of the available resins employed in the prior art is about 8% in volume and 2% in each linear dimension. This shrinkage can effect the dimensional accuracy of the three dimensional model in the following principal ways: two-dimensional linear scale changes, two-dimensional non-linear distortions due to internal stresses with each individual layer as it solidifies and three-dimensional distortions due to stresses arising from stresses in the overall model during a final curing step.

The Hull technique suggests the use of direct laser writing in a vector mode, which requires extreme uniform writing speed in order to maintain a constant energy level and produce a uniform layer thickness and extremely sensitive resins.

SUMMARY OF THE INVENTION

The present invention seeks to provide three-dimensional modeling apparatus, which is fast, accurate and is suitable for use in an industrial environment.

There is thus provided in accordance with a preferred embodiment of the present invention a system responsive to coordinate information for automatically providing a three-dimensional physical model of a desired geometry and comprising apparatus for selectably solidifying a solidifiable material on a sequential layer by layer basis characterized in that following selectable solidification of a given layer, the non-solidified portions thereof are removed and replaced by a removable support material which is not solidifiable under the same conditions as the solidifiable material. There is also provided in accordance with a preferred embodiment of the present invention a method responsive to coordinate information for automatically providing a three-dimensional physical model of a desired geometry and comprising the step of selectably solidifying a solidifiable material on a sequential layer by layer basis characterized in that following selectable solidification of a given layer, the non-solidified portions thereof are removed and replaced by a removable support material which is not solidifiable under the same conditions as the solidifiable material.

Additionally in accordance with a preferred embodiment of the present invention there is provided a system for automatically providing a three-dimensional physical model of a desired geometry and comprising apparatus for sequentially irradiating a plurality of layers of a solidifiable liquid via erasable masks produced in accordance with received coordinate information.

Further in accordance with a preferred embodiment of the present invention there is provided a system for automatically providing a three-dimensional physical model of a desired geometry and comprising apparatus for sequentially irradiating a plurality of layers of a solidifiable liquid via masks in a non-contacting proximity exposure wherein the masks are produced in accordance with received coordinate information, compensating for distortions resulting from the separation of the masks from the layers and the use of non-collimated illumination in the non-contacting proximity exposure. Additionally in accordance with a preferred embodiment of the invention there is provided a method of automatically providing a three-dimensional physical model of a desired geometry and comprising the steps of sequentially irradiating a plurality of layers of a solidifiable liquid via erasable masks produced in accordance with received coordinate information.

Further in accordance with a preferred embodiment of the present invention there is provided a method for automatically providing a three-dimensional physical model of a desired geometry and comprising the steps of sequentially irradiating a plurality of layers of a solidifiable liquid via masks in a non-contacting proximity exposure wherein the masks are produced in accordance with received coordinate information, compensating for distortions resulting from the separation of the masks from the layers and the use of non-collimated illumination in the non-contacting proximity exposure.

It is a particular feature of the present invention that the mask production with compensation can occur in real time or near real time and is carried out preferably by a straightforward linear transformation of coordinates. Such a transformation can be carried out readily as part of a vector to raster conversion process which normally occurs in preparation for three-dimensional modeling.

According to a further embodiment of the invention, exposure through the erasable mask may be line-by-line exposure using an electro-optic shutter, such as a light switching array, or frame-by-frame exposure using a planar array such as an LCD array.

As an further alternative, the mask may be written directly onto the surface of the solidifiable liquid as by an ink jet printer or plotter.

Further in accordance with a preferred embodiment of the present invention, the solidifiable liquid is formulated to have relatively small amounts of shrinkage.

According to a preferred embodiment of the invention, the active resin in the solidifiable liquid, which has a given shrinkage coefficient is mixed with another resin which has a given expansion coefficient in order to provide a mixture which has a zero or near zero shrinkage coefficient.

According to an alternative embodiment of the present invention, radiation of the liquid layer is carried out such that as shrinkage occurs, additional solidifiable liquid moves into place to take up the shrinkage and is solidified, uniform thickness of the entire solidified portion of the solidifiable liquid layer being maintained.

According to a further alternative embodiment of the invention, radiation of the liquid layer may be patterned to restrict shrinkage at any given time to localized areas.

Additional apparatus and methods of modeling are also provided in accordance with preferred embodiments of the present invention.

BRIEF DESCRIPTION OF THE DRAWINGS

The present invention will be understood and appreciated more fully from the following detailed description, taken in conjunction with the drawings in which:

FIG. 12 is an illustration of a technique for removal of non-polymerized solidifiable material in accordance with an embodiment of the present invention;

FIGS. 13A–13C are an illustration of a technique for solidification of residual non-polymerized solidifiable material in accordance with an embodiment of the present invention;

DETAILED DESCRIPTION OF THE INVENTION

Figure 1A:
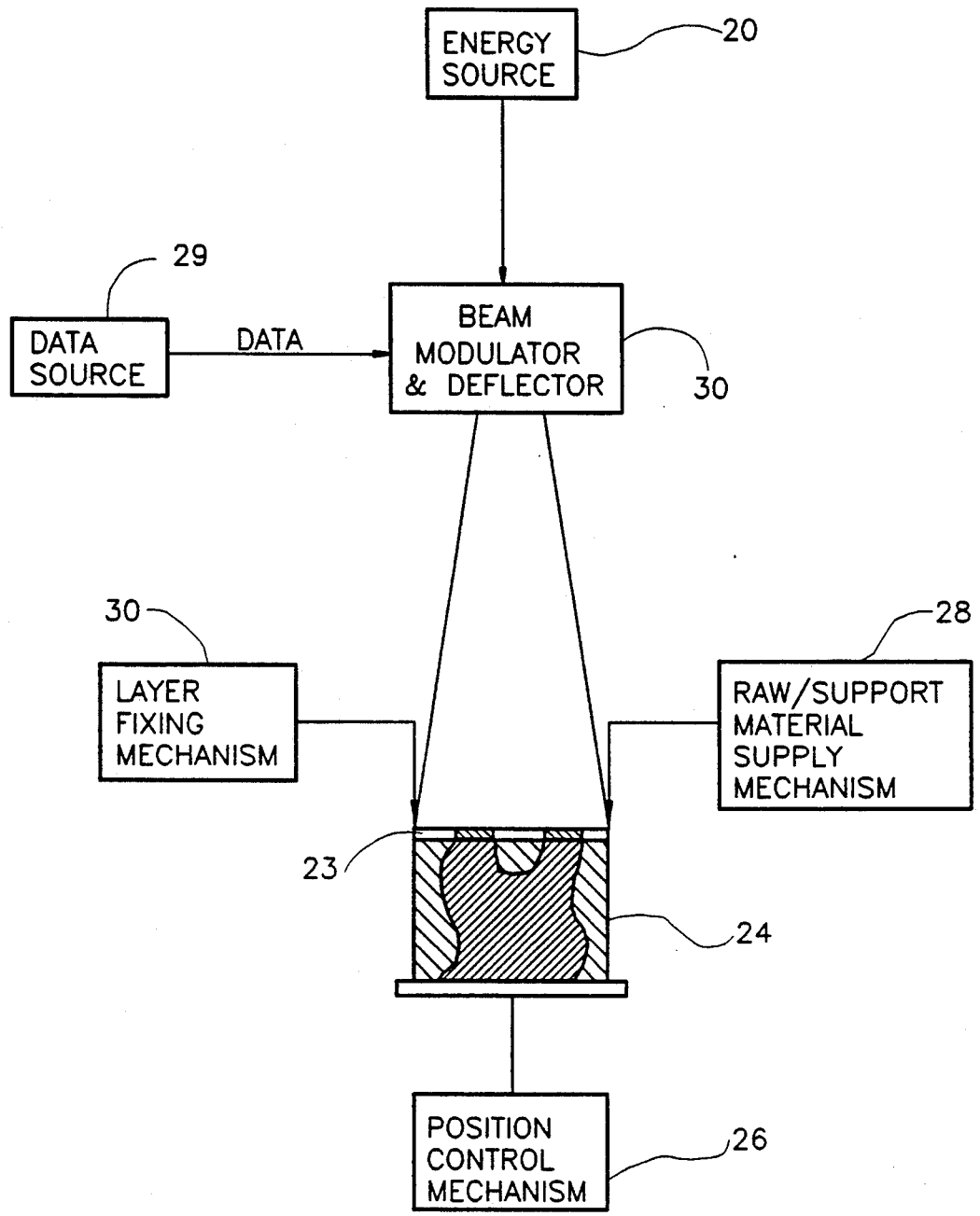
FIGS. 1A and 1B are generalized block diagram illustrations of two alternative embodiments of a three dimensional modeling system constructed and operative in accordance with a preferred embodiment of the present invention.
Figure 1B:
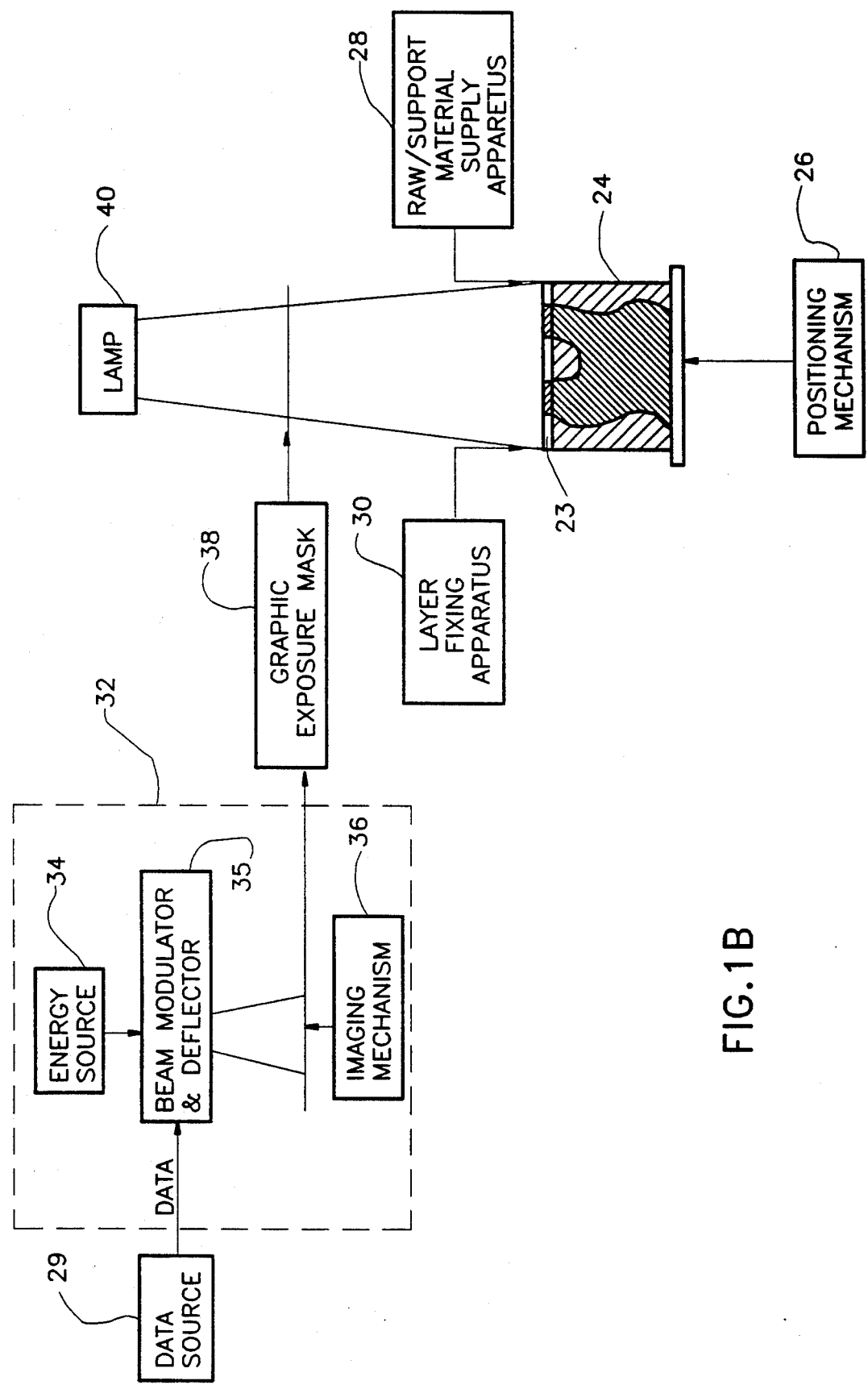

Reference is now made to FIGS. 1A and 1B which generally illustrate two alternative preferred embodiments of a three-dimensional modeling generator. The embodiment of FIG. 1A provides direct exposure of a solidifiable liquid, while the embodiment of FIG. 1B provides indirect exposure thereof.

Considering first the embodiment of FIG. 1A, there is seen an energy source 20, such as a laser or a strong arc lamp having a short gap, which provides a beam of radiation via a beam modulator and deflector 30, which receives a data input from a data source 29. Data source 29 may comprise any suitable data source and may comprise a computer aided design (CAD) system, a computerized tomograph (CT) scanner, a graphic workstation, such as a PRISMA system manufactured by Scitex Corporation of Herzlia, Israel, or a digital terrain model (DTM), implemented in a cartographic system such as an R280 system manufactured by Scitex Corporation.

The modulated and deflected beam impinges on a layer of a solidifiable liquid, lying in a solidification plane 23. The solidifiable liquid may be any suitable radiation polymerizable material which is commonly used in the coating and printing industries. Examples of such materials are as follows: 6180 of Vitralit, of Zurich, Switzerland, ELC 4480 of Electro-Lite Corporation of Danbury, Conn., U.S.A. and UVE-1014 of General Electric Company of Schenectady, N.Y., U.S.A.

The solidifiable layer is typically supported on a positioning mechanism 26 and is associated with raw material and support material supply apparatus 28 and layer fixing apparatus 30. A plurality of layers defining a built up model 24 are selectably solidified on a sequential layer by layer basis wherein following selectable solidification of a given layer, the non-solidified portions thereof are removed and replaced by a removable support material which is not solidifiable under the same conditions as the solidifiable material.

The data received by the beam deflector 30 may be of any suitable form and is typically in raster form, vector form, or a combination of both. When raster data is received, the beam is deflected across the solidification plane so that it periodically sweeps the entire area of the layer in a dense and regular pattern, typically an arrangement of dense parallel lines. This pattern may be realized by deflecting the beam in a fast saw-tooth pattern in a first dimension, and in a slow saw-tooth pattern in a perpendicular dimension. As the beam sweeps the solidification plane, the data from the computer instructs the modulator to switch the radiated energy on and off, so that whenever the beam is directed to a location at which solidification is desired, the radiated energy is provided and whenever the beam is directed to a location at which solidification is not desired, the radiated energy is not provided. A suitable beam deflector driver for use with raster data is a scanning mirror, such as model S-225-015-XLOB5 available from Lincoln Laser Co. of Phoenix, Ariz., U.S.A.

When vector data is received, the beam is deflected to follow the desired contours of the solid parts in the solidification plane and to fill in the area delimited thereby. A suitable beam deflector driver for use with vector data may be found in galvanometric recorders manufactured by Honeywell, Test Instrument Division, Denver, Colo., U.S.A.

Considering now the indirect exposure embodiment of FIG. 1B, there is seen apparatus for producing graphic masks 32, typically including an energy source 34, such as a small visible light laser source, such as a laser diode, a beam deflector and modulator 35 arranged to receive a data output from a computer or a storage medium, and a imaging mechanism 36 which is operative to produce a graphic exposure mask 38 for each layer or group of layers of solidifiable liquid to be exposed, as appropriate.

The graphic exposure mask 38 is then exposed using a light source 40 such as a Model AEL 1B, manufactured by Fusion UV Curing Systems of Rockville, Md., U.S.A. or alternatively any suitable collimated light source. Similarly to the embodiment of FIG. 1A, here the image of the mask is projected onto a solidification plane 23 so as to selectably solidify a layer of solidifiable liquid.

The solidifiable layer is typically supported on a positioning mechanism 26 and is associated with raw material and support material supply apparatus 28 and layer fixing apparatus 30. A plurality of layers are selectably solidified on a sequential layer by layer basis wherein following selectable solidification of a given layer, the non-solidified portions thereof are removed and replaced by a removable support material which is not solidifiable under the same conditions as the solidifiable material.

In accordance with a preferred embodiment of the present invention, pre-processing of configuration information is provided in order to enable complex or hollow objects to be formed by the technique of the present invention.

In accordance with an embodiment of the invention, configuration information is received from a three dimensional CAD system, such as a Unigraphics system, manufactured by McAuto of St. Louis, Mo., U.S.A., in the form a facet file, known as a geometry file generated by the software package known by the tradename "Unipix". The apparatus of the present invention is operative to extract from the facet file, coordinate information in a layer by layer format.

In accordance with an alternative embodiment of the invention, conversion of data from a CAD format to a raster format may be achieved by requiring the CAD system to generate a sequence of parallel sections of the object, each spaced from the other by the desired resolution. Data for each such section is then converted into two dimensional raster format having the desired resolution. A stack of such sections defines a three dimensional matrix.

Sequential sectioning of three-dimensional objects is a conventional capability in CAD systems and is known as a "topographical map function" in the MEDUSA system available from Prime Computer, of Natick, Mass. Two dimensional conversion of CAD data into raster form is entirely conventional and is commercially available in the Quantum 1 system manufactured by Scitex Corporation Ltd. of Herzlia, Israel, and is known as the "plot" function in that system.

Figure 1C:
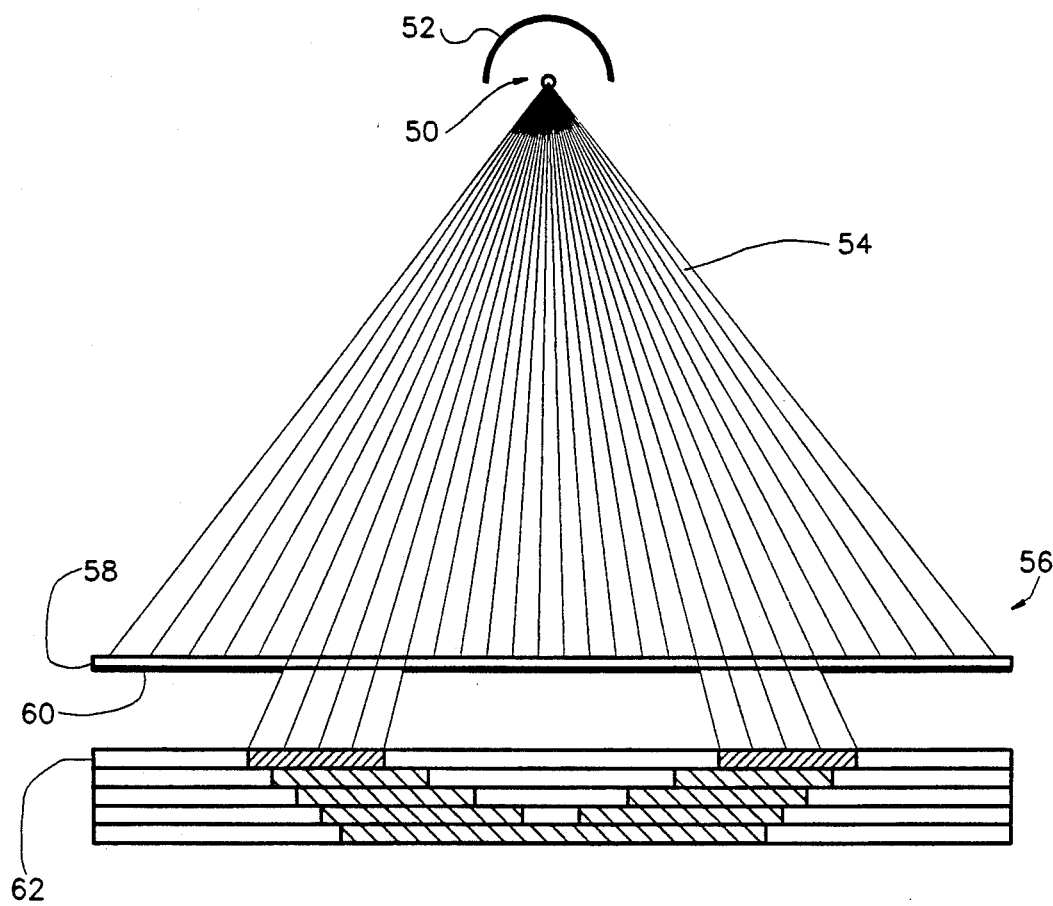
FIG. 1C is a pictorial illustration of proximity exposure employed, according to a preferred embodiment of the invention, in the apparatus of FIGS. 1A and 1B.

Reference is now made to FIG. 1C, which illustrates non-contacting proximity exposure which is employed in accordance with a preferred embodiment of the present invention. A light source 50 and associated reflector 52, typically embodied in a Model AEL 1B, manufactured by Fusion UV Curing Systems of Rockville, Md., U.S.A. emits a generally conical beam 54 of light within the UV band, which impinges on a mask 56. Mask 56 typically comprises a transparent substrate 58, preferably formed of glass on the underside of which is formed, as by xerographic coating, a mask pattern 60.

The mask 56 is preferably spaced from the top surface of a solidifiable layer 62 in order to prevent possible contamination of the mask 56 by the solidifiable material. A preferred separation distance is between 0.5 and 1.0 millimeter.

It is a particular feature of the present invention that the configuration and dimensions of mask pattern 60 are determined in order to compensate for the distortions produced by the effect of the separation of the mask 56 from the layer 62 under non-collimated illumination.

Figure 2:
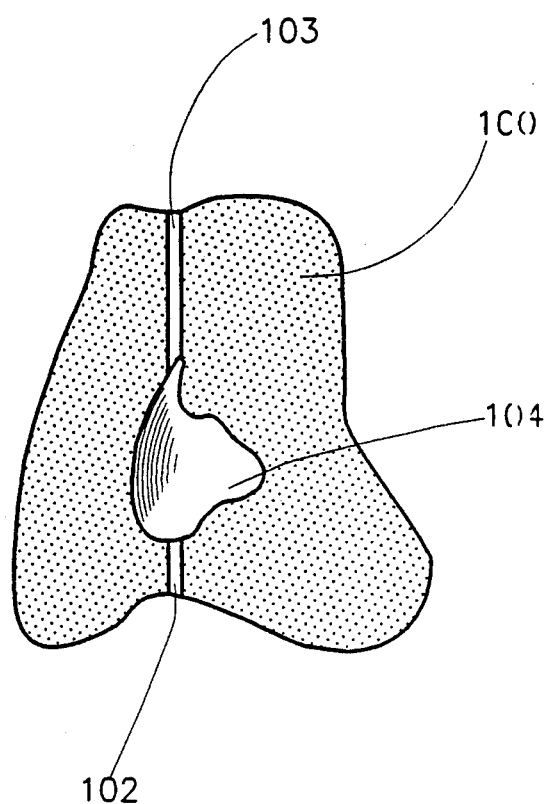
FIG. 2 is a cross sectional illustration of a hollow object formed in accordance with the present invention and including liquid drain conduits formed therein.

Referring now to FIG. 2, there is seen a hollow object 100 constructed in accordance with the present invention. In accordance with a preferred embodiment of the present invention, a drainage conduit 102 and an air conduit 103 are formed in the model as it is built up in order to permit drainage of support material from the hollow region 104. The formation of such drainage conduits can take place in accordance with the following sequence of operative steps:

1. Start examining a layer (the examined layer) at the top of the three dimensional matrix and begin to check each layer, layer by layer;
2. Check whether the examined layer of the matrix is also the lowest layer, if yes, go to Step 9;
3. Identify the areas in the examined layer having a zero binary value (this may be achieved using an algorithm available in the "clar" function in the R-280 system of Scitex Corporation Ltd.);
4. Check whether the zero areas in the examined layer overlap any zero areas in the preceding layer that was checked;
5. If no, declare a new cavity and assign the non overlap zero areas thereto and proceed to Step 2 for a subsequent layer lying below the previous examined layer;
6. If yes, and if the zero area in the examined layer overlaps exactly one zero area in the previous examined layer, assign it to the same cavity as that to which that zero area in the previous examined layer is assigned and proceed to Step 2 for a subsequent layer lying below the previous examined layer;
7. If yes, and if the zero area in the examined layer overlaps more than one zero area in the previous examined layer, and all of the overlapped zero areas in the previous examined layer are assigned to the same cavity, then assign the zero area in the examined layer to the same cavity as that to which the overlapped zero areas in the previous examined layer is assigned and proceed to Step 2 for a subsequent layer lying below the previous examined layer;
8. If yes, and if the zero area in the examined layer overlaps more than one zero area in the previous examined layer, and the overlapped zero areas in the previous examined layer are assigned to different cavities, then assign the zero area in the examined layer and reassign all zero areas communicating therewith in earlier examined layers to a single cavity, discard the remaining cavity designations for the reassigned zero areas, and proceed to step 2 for a subsequent layer lying below the previous examined layer;
9. Once all of the layers of the matrix have been examined, determine the minimum and maximum values of X, Y and Z of each cavity;
10. If any of these values lies at the periphery of the matrix, discard such cavity, as it is not isolated. All other cavities are considered to be isolated;
11. For each isolated cavity choose X and Y coordinates on the extreme top and bottom locations therein having respective highest and lowest Z values;
12. For each cavity, assign zero values to locations having the same X and Y coordinates as the top location or coordinates in the vicinity thereof and higher Z values than the top location, thus defining a conduit;
13. For each cavity, assign zero values to locations having the same X and Y coordinates as the bottom location or coordinates in the vicinity thereof and lower Z values than the bottom location, thus defining a conduit;
14. Optionally, the steps 12 and 13 may be terminated when the channels defined thereby communicate with a cavity which already has defined in association therewith conduits communicating with the periphery of the matrix.
15. Optionally, the channels may be blocked after drainage by filling or partially filling them with solidifiable liquid and then solidifying them.

Figure 3:
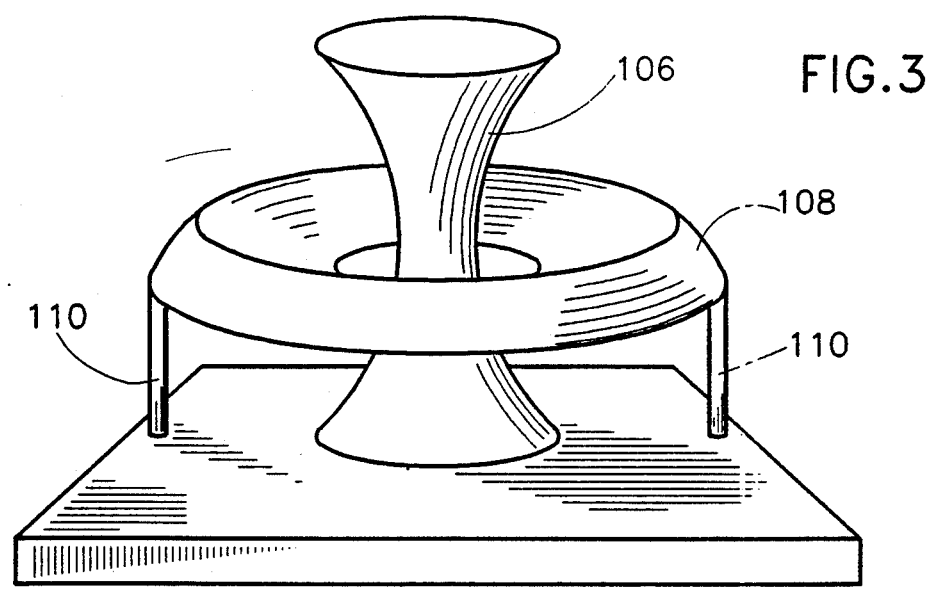
FIG. 3 is a pictorial illustration of a complex object formed in accordance with the present invention and including support legs integrally formed therewith.

Reference is now made to FIG. 3, which illustrates an object constructed in accordance with the present invention and comprising mutually isolated parts 106 and 108. In accordance with an embodiment of the present invention, where a solid material is not employed, solid support legs 110 are generated to support the isolated parts on the floor of the container or onto another part which is, itself, suitably supported. The thickness of the support legs is preferably determined by the load to be supported thereby during modeling.

The formation of such support legs takes place in accordance with the following sequence of operative steps:

1. Start examining a layer (the examined layer) at the top of the three dimensional matrix and begin to check each layer, layer by layer;
2. Check whether the examined layer of the matrix is also the lowest layer. If yes, go to step 9;
3. Identify the areas in the examined layer having a unitary binary value (one areas). (This may be achieved using an algorithm available in the "clar" function in the R-280 system of Scitex Corporation Ltd.);
4. Check whether the one areas in the examined layer overlap any one areas in the preceding layer that was checked;
5. If no, declare a new part and assign the non overlap one areas thereto and proceed to step 2 for a subsequent layer lying below the previous examined layer;
6. If yes, and if the one area in the examined layer overlaps exactly one one area in the previous examined layer, assign it to the same part as that to which that one area in the previous examined layer is assigned and proceed to step 2 for a subsequent layer lying below the previous examined layer;
7. If yes, and if the one area in the examined layer overlaps more than one one area in the previous examined layer and all of the overlapped one areas in the previous examined layer are assigned to the same part, then assign the one area in the examined layer to the same part as that to which the overlapped one areas in the previous examined layer are assigned and proceed to step 2 for a subsequent layer lying below the previous examined layer;
8. If yes, and if the one area in the examined layer overlaps more than one one area in the previous examined layer, and the overlapped one areas in the previous examined layer are assigned to different parts, then assign the one area in the examined layer and reassign all one areas communicating therewith in earlier examined layers to a single part, discard the remaining part designations for the reassigned one areas, and proceed to step 2 for a subsequent layer lying below the previously examined layer;
9. Once all of the layers of the matrix have been examined, determine the minimum and maximum values of X, Y and Z for all of the parts;
10. If any of the values of minimum Z equals one, then discard that part since it lies on the bottom of the matrix and does not require support. Declare all remaining parts, "isolated parts";
11. For each isolated part determine four points with extreme X and Y coordinates. Preferably choose such locations having divergent X and Y values, so as to provide wide support for the part;
12. For each part, assign one values to locations having the same X and Y coordinates as the extreme locations or coordinates being within a predetermined range, such as 1 mm of the location coordinates of the extreme locations and lower Z values than the extreme locations, thus defining a plurality of support legs;
13. Optionally, the steps 11 and 12 may be terminated when the support legs defined thereby engage a part which already has defined in association therewith conduits communicating with the periphery of the matrix.

Figure 4:
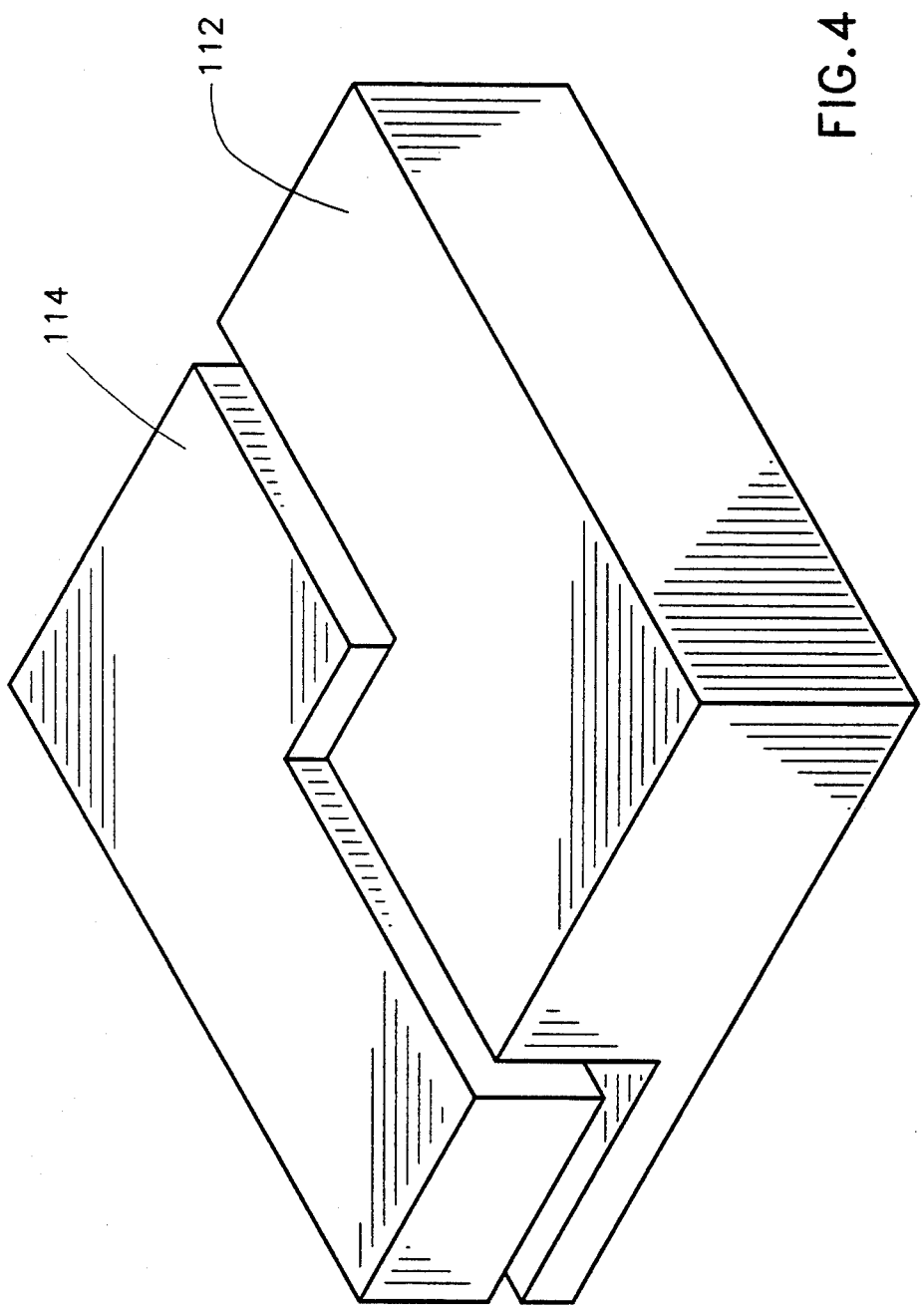
FIG. 4 is a pictorial illustration of two nested objects formed in accordance with the present invention.

Additionally in accordance with a preferred embodiment of the present invention, as seen in FIG. 4, a plurality of separate objects 112 and 114 may be modeled together and placed with respect to each other so that they do not touch, while at the same time, the plurality of objects is mutually nested so as to occupy a minimum overall volume.

A technique for efficient nesting of a plurality of objects to be modeled at the same time may take place in accordance with the following sequence of operative steps:

1. For each of the objects to be modeled, determine the extreme coordinates and compute a minimum bounding volume in the form of a box for each such object;
2. Sort the bounding volumes in decreasing order of volume;
3. Define a three-dimensional raster matrix (master matrix) in which the objects will be located;
4. Place the biggest bounding volume in the matrix by copying the contents of the matrix of that object into the master matrix, starting at location (1, 1, 1);
5. For each of the remaining bounding volumes, start with the next biggest volume and proceed one by one until the smallest volume is reached, in each case determine an orientation in the master matrix in which it can be placed without overlapping or touching any of the previously located bounding volumes, while causing no expansion or a minimal expansion of the originally selected master matrix defined volume. In the course of fitting trials, the 6 possible orthogonal orientations may be tried;
6. When the best fit is found, place each of the remaining bounding volumes in its best fit location;
7. The procedure for generating support legs described above in connection with FIG. 6 may be employed to provide supports between adjacent non-touching objects. Any other suitable technique may also be employed for this purpose.

Figure 5A:
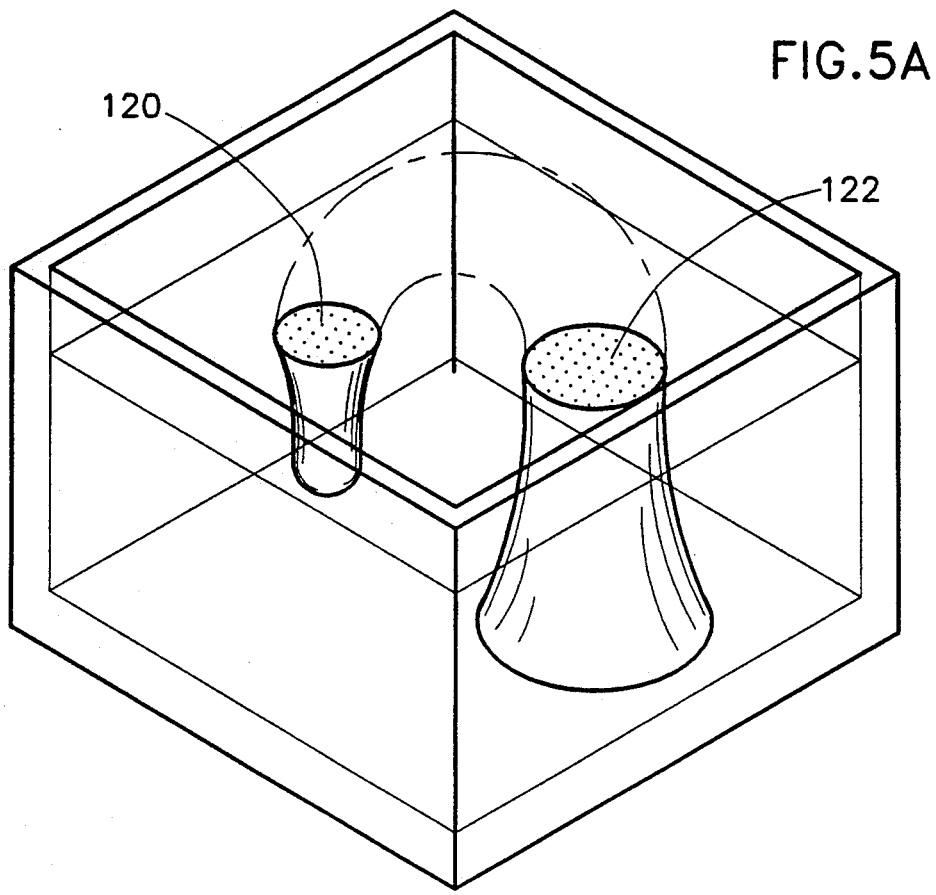
FIGS. 5A and 5B are illustrations of initially isolated parts of an object during formation thereof in accordance with the present invention and of the finished object respectively.
Figure 5B:
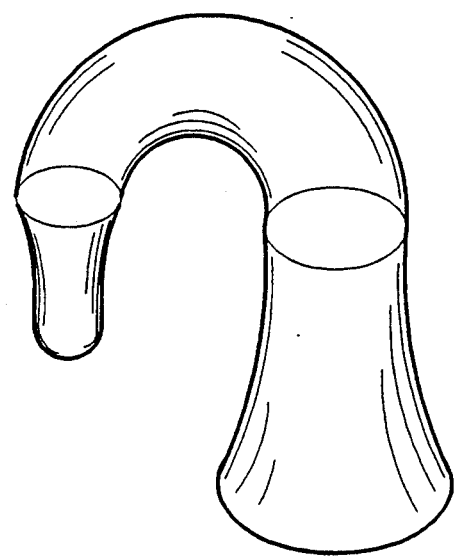

Reference is now made to FIGS. 5A and 5B which illustrate the modeling of an object which includes initially isolated portions which are joined as the model is built up from bottom to top. FIG. 5A shows the model at an intermediate stage having a portion 120 isolated from the main portion 122, such that portion 120 requires support. FIG. 5B shows the completed model wherein the two portions have been joined such that portion 120 does not require additional support.

If the support material is chosen to be a material which lacks the rigidity to support portion 120, intermediate support may be realized by initially identifying those portions which require intermediate support and afterwards generating solid support legs, as described hereinabove in connection with FIG. 3.

The steps of identifying those portions which require support may include the following sequence of operative steps:

1. Start examining a layer (the examined layer) at the bottom of the three dimensional matrix and begin to check each layer, layer by layer;

2. Identify the areas in the examined layer having a unitary binary value (one areas). (This may be achieved using an algorithm available in the "clar" function in the R-280 system of Scitex Corporation Ltd.);

3. Check whether the one areas in the examined layer overlap any one areas in the preceding layer that was checked;

4. If no, declare an isolated area and proceed with the following steps. If yes proceed to step 2 for the next layer;

5. Generate a support for every isolated area, either by the technique described above in connection with FIG. 6 or by generating a mesh as follows;

6. Write from memory a two dimensional mesh matrix, typically lying in a plane parallel to the solidification plane and including lines of width of the order of 1-3 voxels. The mesh is superimposed on the plane of the isolated area and joins the isolated area to the walls of the container and to stable objects therewithin. The mesh may readily be removed when the model is completed.

Additionally in accordance with an embodiment of the invention, reference markings may be incorporated in the model by selectably changing the coloring of the solidifiable liquid at predetermined layers.

Figure 6:
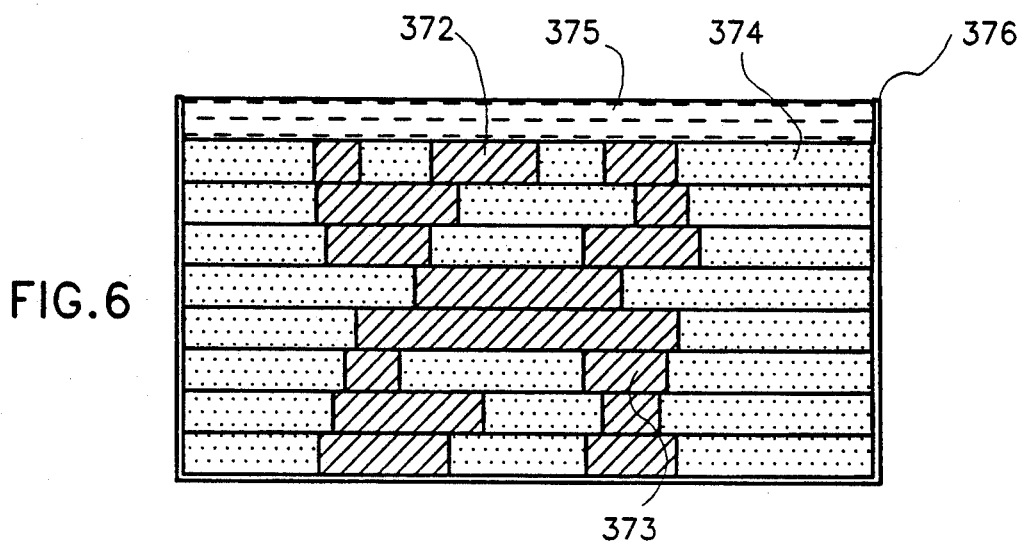
FIG. 6 is an illustration of a three-dimensional mapping and modeling technique employing a solid supporting material.

Reference is now made to FIG. 6 which illustrates an alternative embodiment of the invention wherein a solidifiable liquid layer 375 is provided in a container 376 only at the solidification plane. Therebelow is disposed a support material 374, typically in solid form. In each layer, the polymerized resin is illustrated at reference numeral 372. The non-polymerized resin is removed from the non-polymerized regions of each layer which are then are filled with a support material 374, which may initially be in a liquid or paste form. Accordingly, the depth of solidification is determined by the thickness of the solidification liquid layer 375. As a model 373 is built up (possibly in a container 376), the height of the support material is increased accordingly such that it reaches to just below the solidification plane.

Solidification of the wax is preferably accelerated by application of a cold plate in contact with the surface of layer 375. Alternatively any other suitable technique for rapidly cooling the surface may be employed.

The application of the support material 374 may be by spreading or by any other suitable technique. The support material can be allowed to solidify. An example of a suitable solidifiable support material is casting wax such as Cerita Filler Pattern Wax F 875, available from M. Argueso & Co., Inc. of Mamaroneck, N.Y., U.S.A. This wax may be applied as a liquid at between 50 and 80 degrees centigrade and then be allowed to solidify at room temperature.

Upon completion of the model, the wax may be removed by melting, as it will melt at about 60 degrees centigrade, while typical polymers employed as solidifiable materials in the present invention can withstand temperatures as high as 90 degrees centigrade without degradation. It is noted that heating of the wax causes expansion thereof, which could, in certain circumstances, damage the model.

According to the present invention, support materials other than wax may be employed. One example of another suitable support material is expandable polystyrene (EPS) which may be applied as a liquid, which solidifies into a rigid foam and which may be removed afterwards by use of suitable solvents such as acetone.

Melting of the wax may be achieved by heating in an oven. If it is sought to use a microwave oven for this purpose, an additive, such as water can be added to the wax to absorb microwave energy. An example of a microwavable wax is 28-17 manufactured by M. Argueso & Co.

Alternatively, and particularly when expansion of the wax is not acceptable, the support material can be removed by rinsing with a solvent. If water is to be used as a solvent, the support material can be Cerita Soluble Wax No 999, also available from M. Argueso & Co., Inc.

Figure 7:
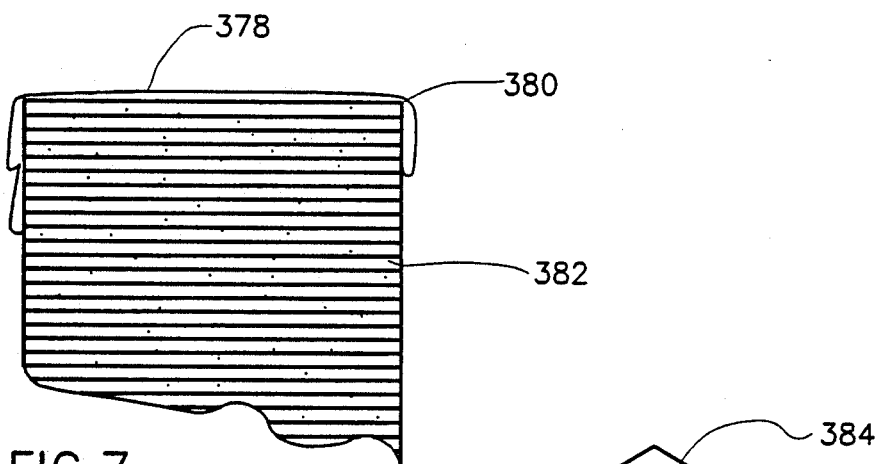
FIG. 7 illustrates a problem of spillover of solidifiable material.

The use of a solid support material provides the possibility of modeling without the use of a container. A difficulty can be foreseen however, spillover of the solidifiable material, prior to hardening thereof. FIG. 7 illustrates this anticipated problem and shows a layer 378 of polymerizable material, such as a resin, spread over previously formed layers 382. Spillover is illustrated at reference numeral 380.

Figure 8:
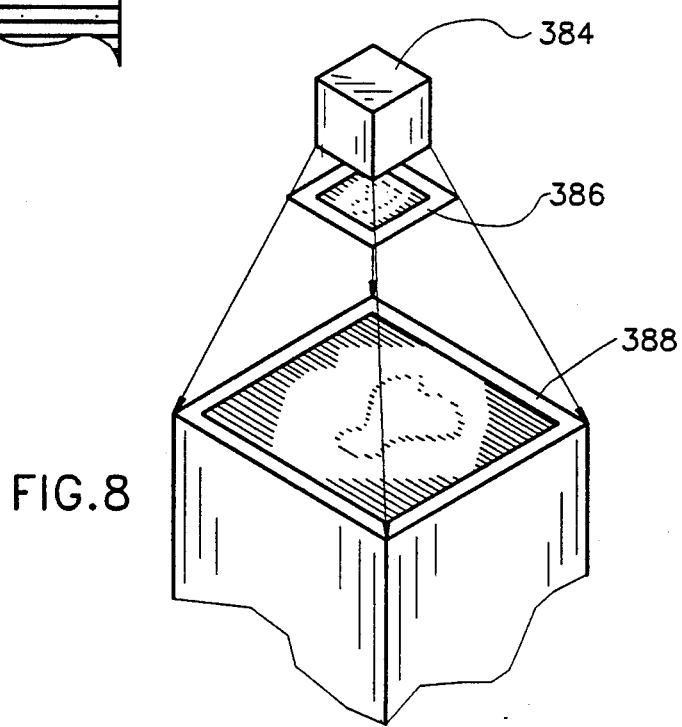
FIG. 8 illustrates a technique for overcoming the problem of spillover of solidifiable material.

The problem of spillover can be eliminated by maintaining a peripheral barrier around the exposure plane. According to a preferred embodiment of the present invention, the problem of spillover may be obviated as shown in FIG. 8. A boundary 388 is formed around the layer, as by photopolymerization of a polymerizable material by exposure thereof to strong UV light from a light source 384 via a mask 386, which defines the boundary.

Figure 9:
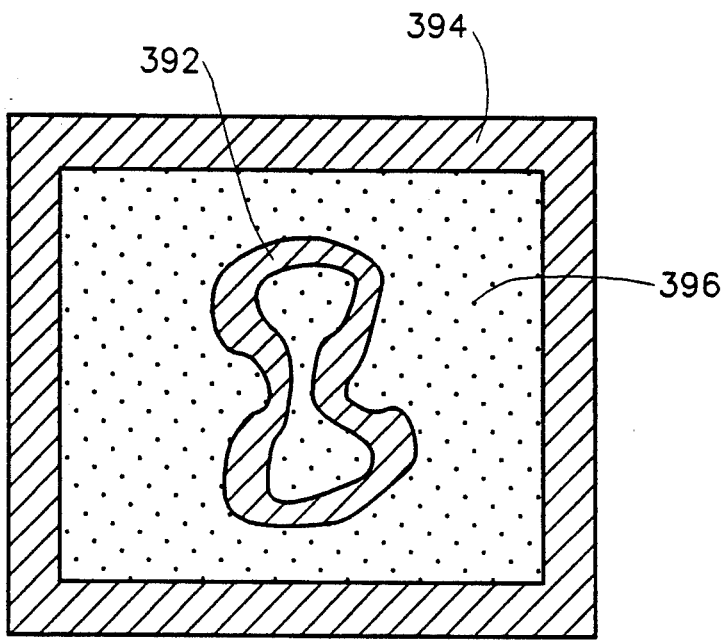
FIG. 9 illustrates a section of a three-dimensional model formed according to an embodiment of the invention which overcomes the problem of spillover of solidifiable material.

Separate exposure of the boundary using the apparatus shown in FIG. 8 may be obviated, however, if the boundary is incorporated by the modeling software in the image data itself. FIG. 9 illustrates a layer produced by such integrated modeling software including a object 392, a boundary 394 and support material 396.

Figure 10:
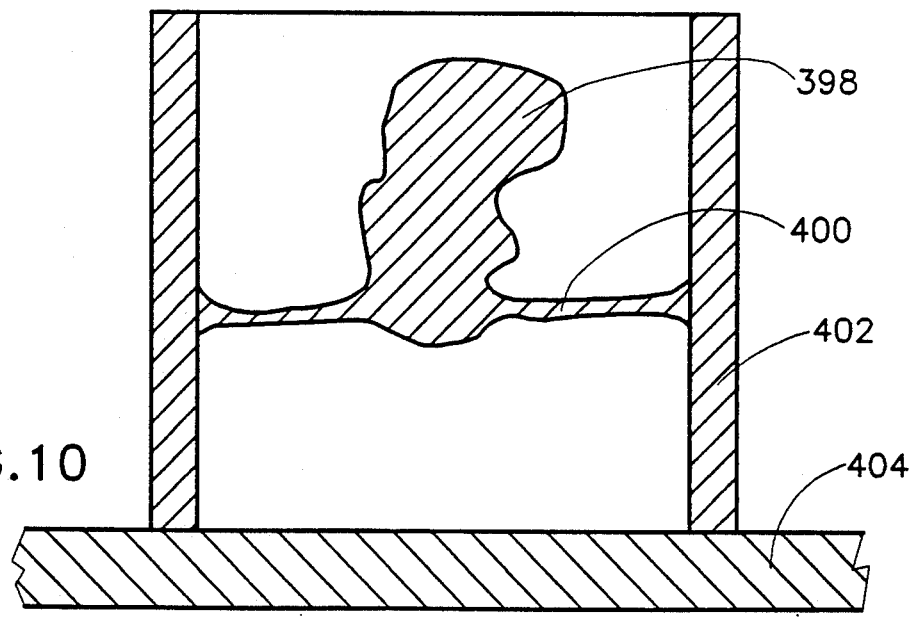
FIG. 10 is a side sectional illustration of support elements joining a three-dimensional model to a surrounding enclosure in accordance with a technique of the type shown in either of FIGS. 8 and 9.

Reference is now made to FIG. 10, which illustrates the use of the built up boundary 402 to support a modeled body 398 by means of support elements 400, which are generated integrally with boundary 402, which is supported in turn on a base 404.

Figure 11:
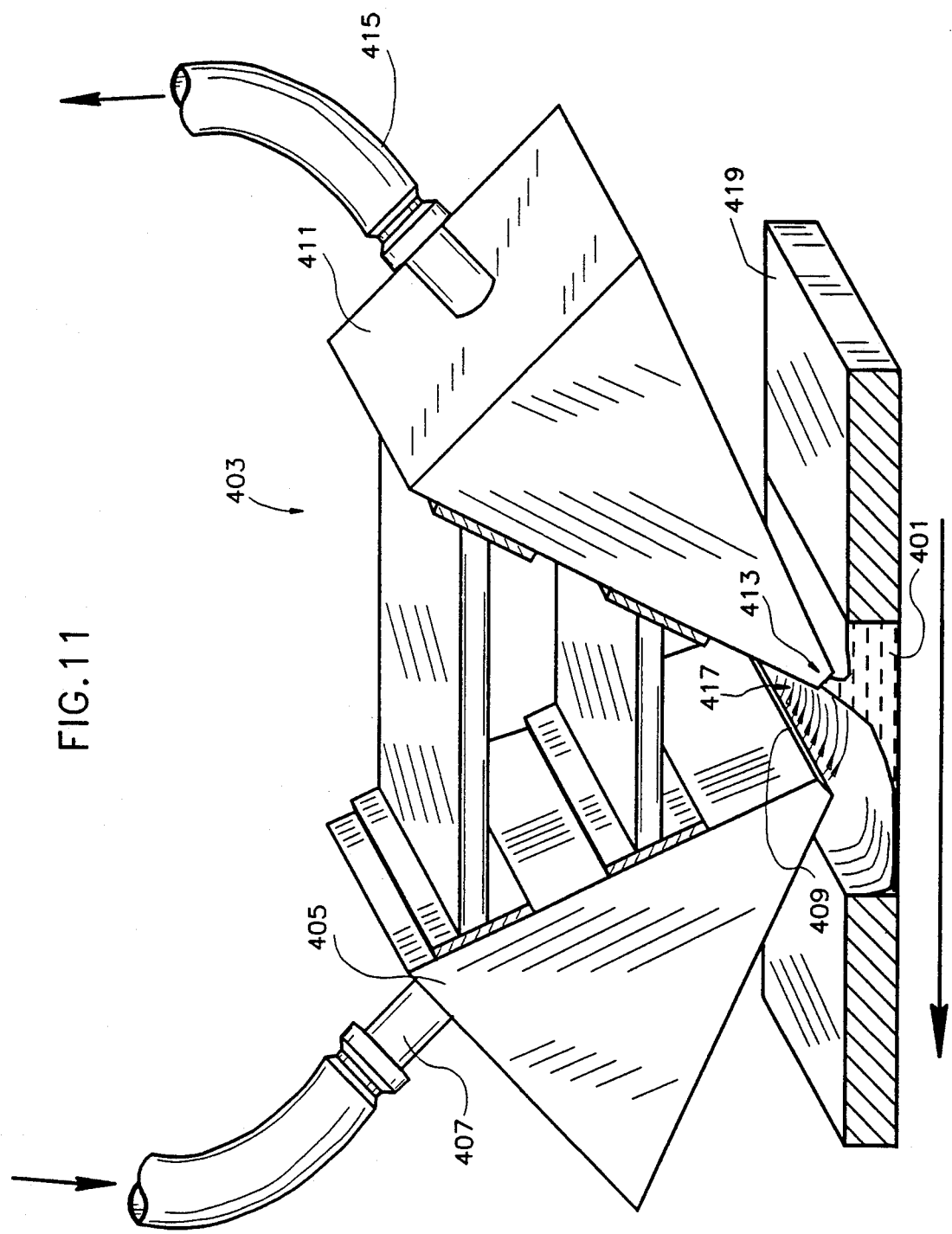
FIG. 11 is a perspective view illustration of a material removal mechanism employing a fluid strip in accordance with an embodiment of the present invention.

Reference is now made to FIG. 11, which illustrates a preferred embodiment of apparatus for reclaiming of unsolidified solidifiable material 401. The apparatus comprises a "push-pull" fluid strip generator 403 including a "push" portion 405 having a fluid stream inlet 407, coupled to a source of a pressurized fluid such as a gas, typically air, and defining an elongate nozzle 409. The "push" portion 405 is fixedly attached to a "pull" portion 411, having an elongate inlet nozzle 413 which is arranged in spaced registration with nozzle 409 which communicates with a fluid outlet 415 coupled to a vacuum source (not shown).

Operation of the fluid strip generator 403 provides a fluid conveyer which defines a fluid strip 417 between nozzles 409 and 413. The fluid strip 417 draws unsolidified solidifiable material 401 from unexposed regions of a layer 419 and conveys the material 401 via nozzle 413 and outlet 415 to a reclamation reservoir (not shown) or to a disposal location. By providing relative movement between the layer 419 and the generator 403, substantially all of the unsolidified unsolidifiable material may be removed from layer 419 as a prelude to supply thereto of support material.

Additionally in accordance with a preferred embodiment of the present invention, there is provided an alternative technique for removal of unpolymerized solidifiable material without removing the solidified support material. FIG. 12 illustrates four typical stages in such a technique. At stage 1, a resin is partially polymerized, as at 406, in accordance with a predefined pattern, such that part of the resin, as at 408, remains in a non-polymerized state.

At stage 2, a solvent 410, such as iso-propanol, is applied from a dispenser 412. As seen at stage 3, a brush 414 may be employed for mixing the solvent with the resin and thus producing a low viscosity fluid. At stage 4, a vacuum is applied, as via a conduit 416, to remove the low viscosity fluid.

It will be appreciated that notwithstanding the technique described above in connection with FIG. 12, a certain amount of residual unpolymerized resin remains, as indicated at reference numeral 420, in otherwise polymerized resin 418, shown in FIG. 13.

It may be desirable to fully cure the residual resin 418. FIG. 13 shows three stages in a residual resin solidification technique. Stage A is the stage prior to application of the technique of FIG. 12, while stage B illustrates the residual resin. According to a preferred embodiment of the present invention, the entire region containing the residual unpolymerized resin is flooded with UV radiation, thus polymerizing the residual resin as illustrated at stage C of FIG. 13.

The foregoing technique of solidifying the residual unpolymerized resin provides enhanced adhesion between layers at the expense of somewhat lower accuracy, which nevertheless is within acceptable limits.

In accordance with a preferred embodiment of the invention, it may be desirable to control the thickness and flatness of a given layer of the model. This may be accomplished advantageously by spreading a somewhat thicker layer of resin and support material and then mechanical machining subsequent to hardening of the solidifiable material and the support material. The use of such a technique may permit a much wider tolerance in the thickness of application of application of the resin layers.

Mechanical machining may also have the following operational advantages: Vertical accuracy; roughening the layer surface for better adhesion of the next layer; exposure of the polymer which had been covered with wax inadvertently; removal of the upper layer of the support material wax, which may contain oily components; removal of the top layer of the polymerized material which may not be fully polymerized due to oxygen inhibition.

Figure 14:
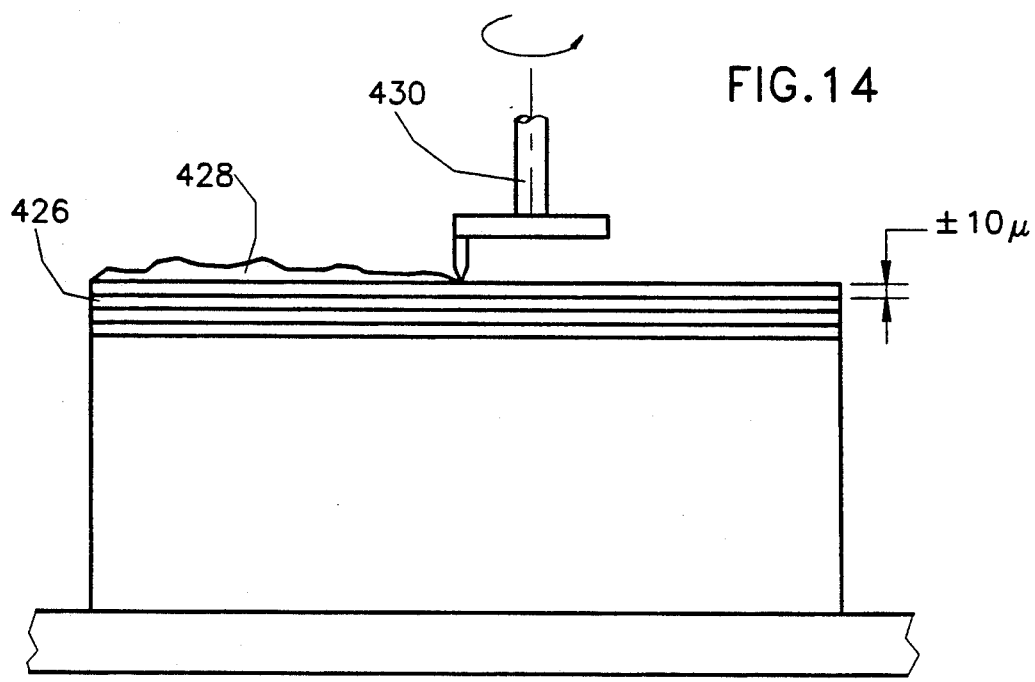
FIG. 14 is an illustration of a technique of controlling the thickness of a layer employing machining techniques.
Figure 15:
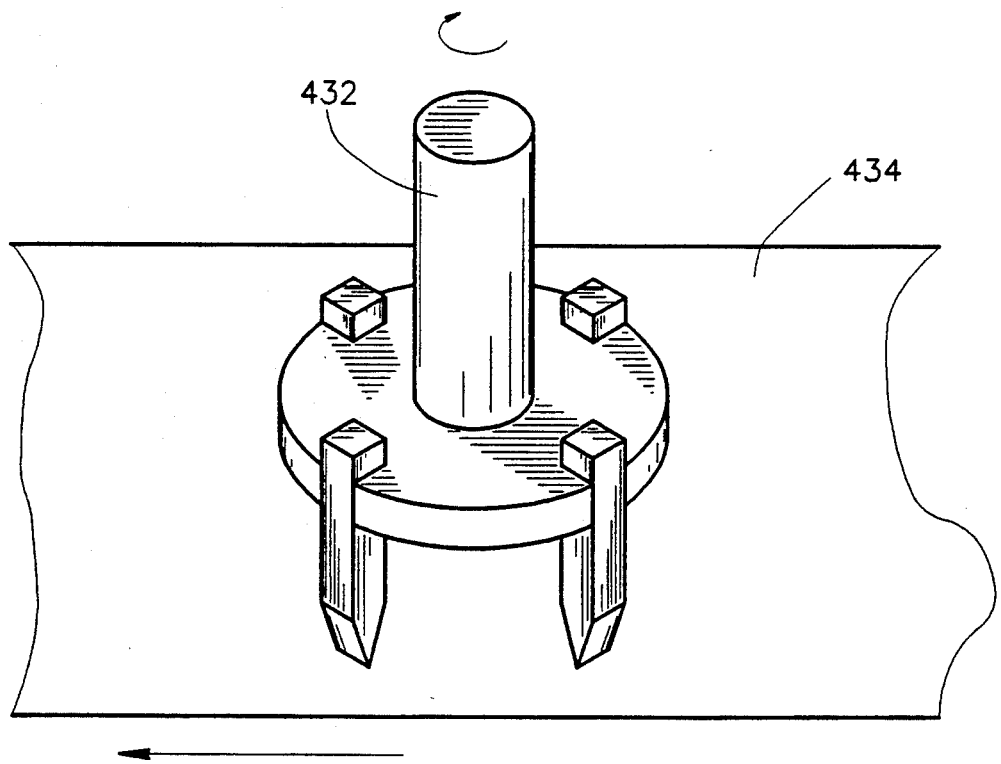
FIG. 15 is an illustration of apparatus useful in the technique of FIG. 14.

FIG. 14 illustrates the use of a single or multiple blade fly cutter 430 to provide uniform thickness layers 426 and to remove excess material 428. FIG. 15 illustrates a typical fly cutter 432 in operative association with a layer surface 434. The use of a fly cutter 432 has the advantage that the net force applied to the workpiece at any given time is almost negligible.

In accordance with the present invention, a problem of spatial distortion due to shrinkage of the solidifiable material upon solidification may be encountered. As noted above, such shrinkage may be as much as 2% in each linear dimension. According to one embodiment of the present invention, the problem of shrinkage may be overcome by using a multiple step irradiation technique, wherein an initial irradiation takes place followed by shrinkage. Excess solidifiable material tends to move into the region vacated by the shrinkage.

A second irradiation step, typically in the same pattern as the first step, takes place. Subsequent irradiation, hardening and filling in cycles may also take place, as desired. The above technique for overcoming the shrinkage problem may also be carried out in a continuous manner, by extending the duration of application of the radiation. This technique is particularly useful in the present invention since, as contrasted with the teachings of Kodama and Hull, the present invention employs a uniform support material which does not solidify in response to radiation which solidifies the solidifiable material, and thus is immune to undesired solidification due to non-uniform application of radiation.

According to an alternative embodiment of the present invention, a non-shrinking solidifiable liquid may be provided by mixing into the usual shrinking solidifiable liquid another liquid which expands upon solidification by about the same amount that the shrinking solidifiable liquid shrinks. The ratio of the two components may be adjusted according to their shrinkage coefficients, so that the mixture has a zero or near zero overall shrinkage coefficient. A typical resin that expands upon polymerization is Norbornene Spiroorthocarbonate, which is mentioned in the proceedings of RADCURE, 1984, at page 11-1. It may be mixed with epoxy-type photopolymers which have the usual shrinkage coefficients of about 2%.

Distortions due to stresses in the model generated during a final curing step may be avoided by eliminating the final curing step, which is made possible by fully curing each layer as it is formed by overexposure of each solidification layer as it is formed. Such is not possible in accordance with the Hull and Kodama teachings.

According to a further alternative embodiment of the present invention, the effects of shrinkage may be reduced by avoiding the simultaneous irradiation and solidification of large areas of the solidifiable layer. In this connection reference is made to FIGS. 16A-16D, which illustrate two step irradiation of a given pattern in complementary checkerboard patterns.

Figure 16E:
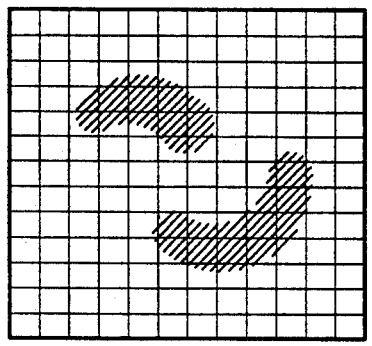
FIGS. 16A, 16B, 16C and 16D illustrate a technique for shrinkage compensation employing radiation through complementary masks.
Figure 16D:
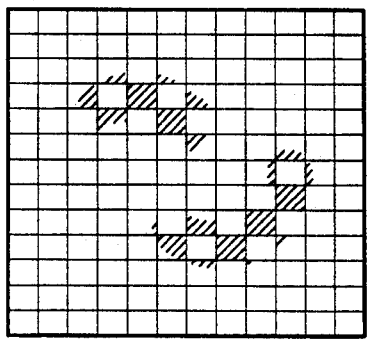
Figure 16B:
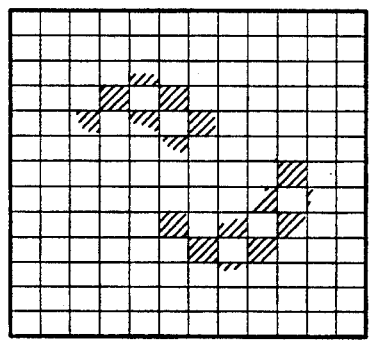
Figure 16A:
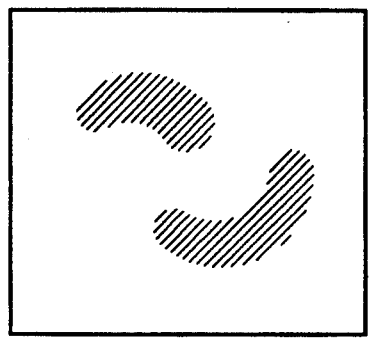

FIG. 16A shows a typical solidification pattern mask for a given layer of a model. In accordance with an embodiment of the invention, this pattern is broken down into two complementary typically checkerboard pattern masks, illustrated in FIGS. 16B and 16C. This pattern breakdown may be realized either photographically, using appropriate screens or electronically by logical AND operation between a mask pattern and a data pattern.

The solidifiable layer is exposed through each of the complementary pattern masks separately, such that distortions due to shrinkage following the first exposure are at least partially compensated during the second exposure. If necessary, a third exposure may be carried out using a mask which corresponds to the complete pattern or selected portions thereof for filling in any unsolidified spaces in the pattern. The result of the complementary pattern exposure technique is a superimposed solidified pattern as seen in FIG. 16D.

According to an alternative embodiment of the invention, the image can be subdivided into localized regions by superimposing thereon a grid pattern. This grid pattern is preferably reoriented for each adjacent layer.

According to a further alternative embodiment of the present invention, shrinkage compensation may be achieved by distorting the exposure masks through pre-processing so as to take into account expected shrinkage in the finished model. Such a technique is employed in molding or casting when molds are distorted for such purpose.

According to an alternative embodiment of the invention, an image may be generated on a transparent plate on a 1:1 or close to 1:1 scale by use of an ionographic electrophotographic method. This method may be implemented using an ion deposition device such, as a model S3000 available from Delphax Systems, Inc. of Toronto, Canada, to charge an electrostatic image on the bottom side of a transparent dielectric plate, such as glass or Plexiglas. As the plate is moved across the device, the image is developed in a single-component development device, such as in model S3000, mentioned above. The plate then carries a visual representation of the image. The plate is then moved into place above the new layer, and serves as an exposure mask for a non-contact imaging process. After exposure, the plate is returned to the coating station, after having been cleaned and discharged.

Cleaning of the plate preferably takes place at the development station, so that almost all of the toner returns to the toner pool and can thus be recycled.

Toner overflow can be compensated by decollimation. In electrophotography, it is known that while the location of the charged image on the dielectric medium is very accurate, the dry toner image tends to overflow from the black areas into the white areas. It is proposed to control the degree of light-collimation so that the white areas will be enlarged on the account of the black areas to compensate for toner overflow, thereby improving the accuracy of the image.

In order to transfer the image to a thick glass plate the plate should be coated with a very thin layer of transparent conductor such as Tin Oxide superimposed by a layer of dielectric material such as mylar. The dielectric material is charged by applying a high voltage to the conductive layer.

Figure 17:
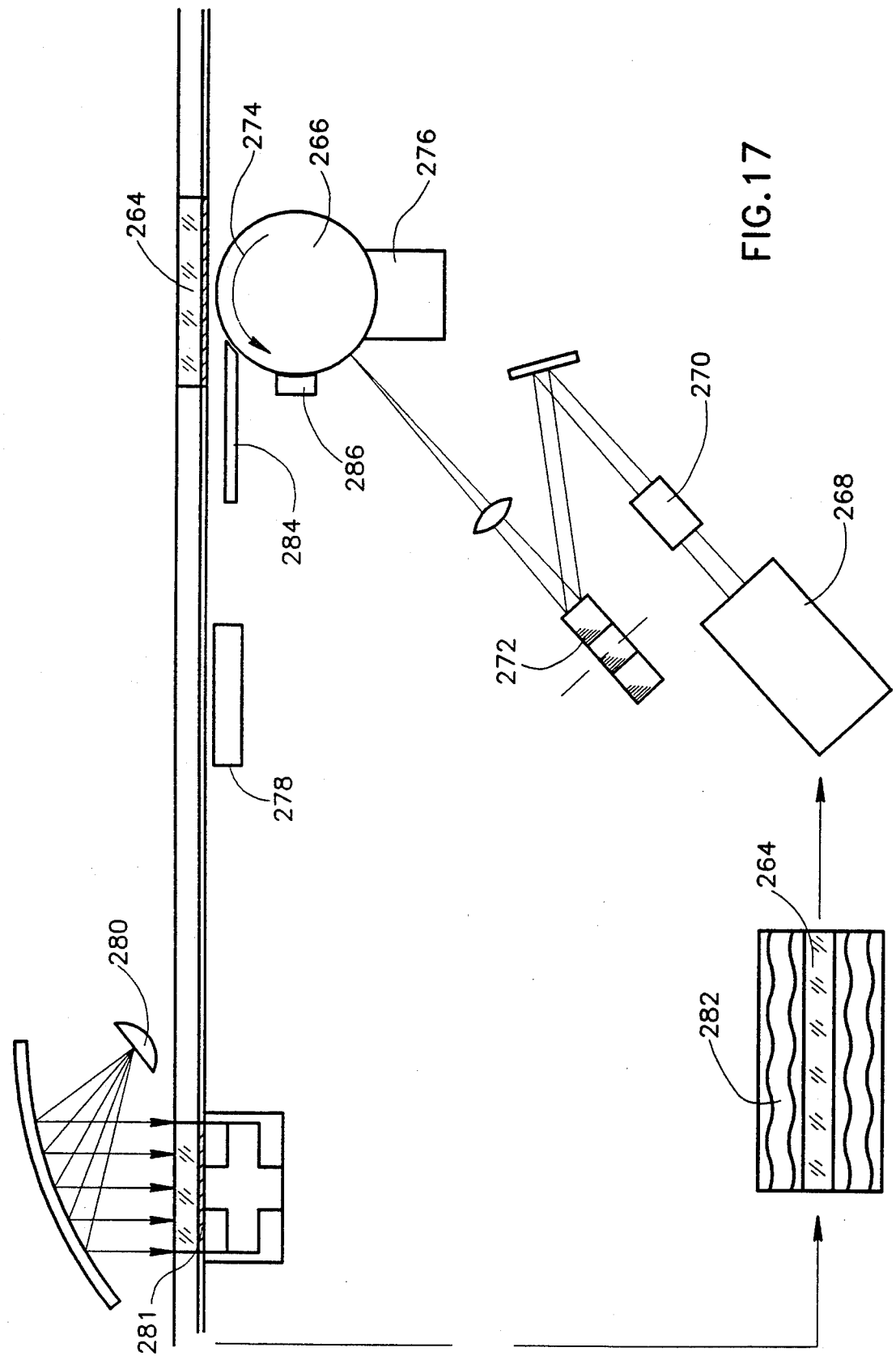
FIG. 17 is a side view pictorial illustration of apparatus for three dimensional modeling in accordance with an alternative embodiment of the present invention.

Reference is now made to FIG. 17, which illustrates an alternative indirect exposure technique which differs from the apparatus and technique illustrated in FIG. 1B in that it eliminates the use of photographic film, which is somewhat expensive and replaces it by an erasable mask.

As seen in FIG. 17, the mask is typically formed on a glass substrate 264 as by an electrophotographic technique. A desired pattern typically is generated on a charged electrophotographic drum 266 using a laser beam from a laser source 268, passing through a beam modulator 270 and via a scanning device 272, which causes the beam to write line by line on the drum 266.

Rotation of the drum in a direction 274 causes the written surface of the drum 266 to receive toner on the written pattern from a reservoir 276. The toner pattern is then contact transferred onto substrate 264 and is subsequently fused thereon at a conventional fusing station 278. According to an alternative embodiment of the invention, the toner pattern is not directly transferred from the drum to the substrates, but instead one or more intermediate transfer cylinders are employed for this purpose.

The patterned mask is conveyed into contact or near contact printing relationship with the solidifiable layer 281 and flood exposed as by a bright light source, such as a mercury vapor lamp 280.

After exposure, the substrate is rinsed, cleaned and dried at a cleaning station 282 and recycled for re-use.

After transfer of the image to the substrate 264, the drum surface is cleaned by a cleaning blade 284 and is uniformly charged as by a corona discharge device 286 before being written upon once again.

Advantages of the above-described embodiment include the ability to employ flood exposure of the solidifiable layer while maintaining relatively short exposure times without requiring highly sensitive photopolymers or the use of expensive photographic film.

Figure 18:
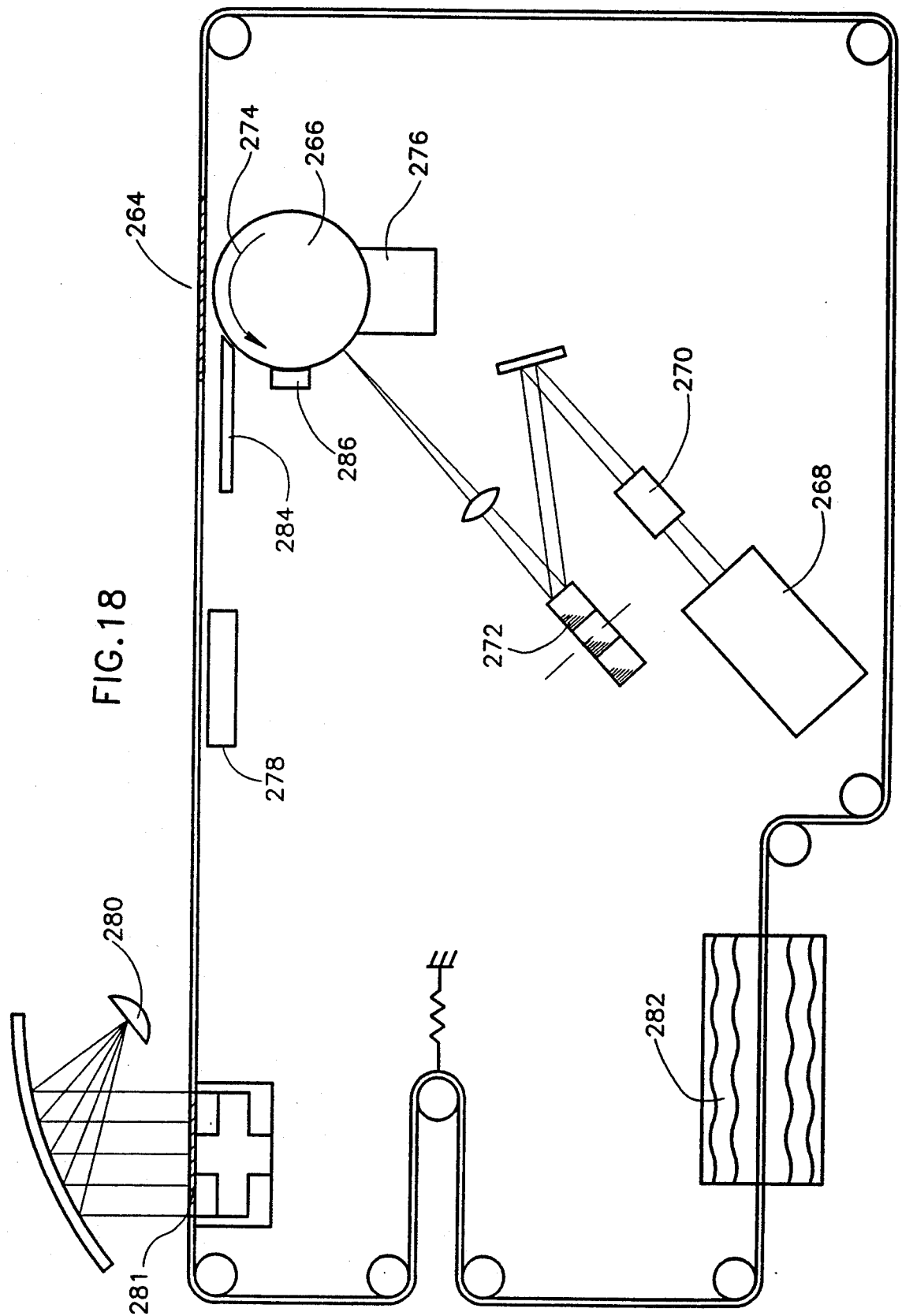
FIG. 18 is a side view pictorial illustration of a variation of the apparatus of FIG. 17.

According to an alternative embodiment of the invention, the apparatus of FIG. 17 may employ a continuous band of mylar or other flexible substrate instead of glass. Such an embodiment is illustrated in FIG. 18, the same reference numerals being employed to designate equivalent elements to those in FIG. 17. The substrate may be reused or alternatively discarded after one or more use. Where disposable masks are employed, they may be produced by any suitable laser printer or plotter operating in a conventional mode.

Figure 19:
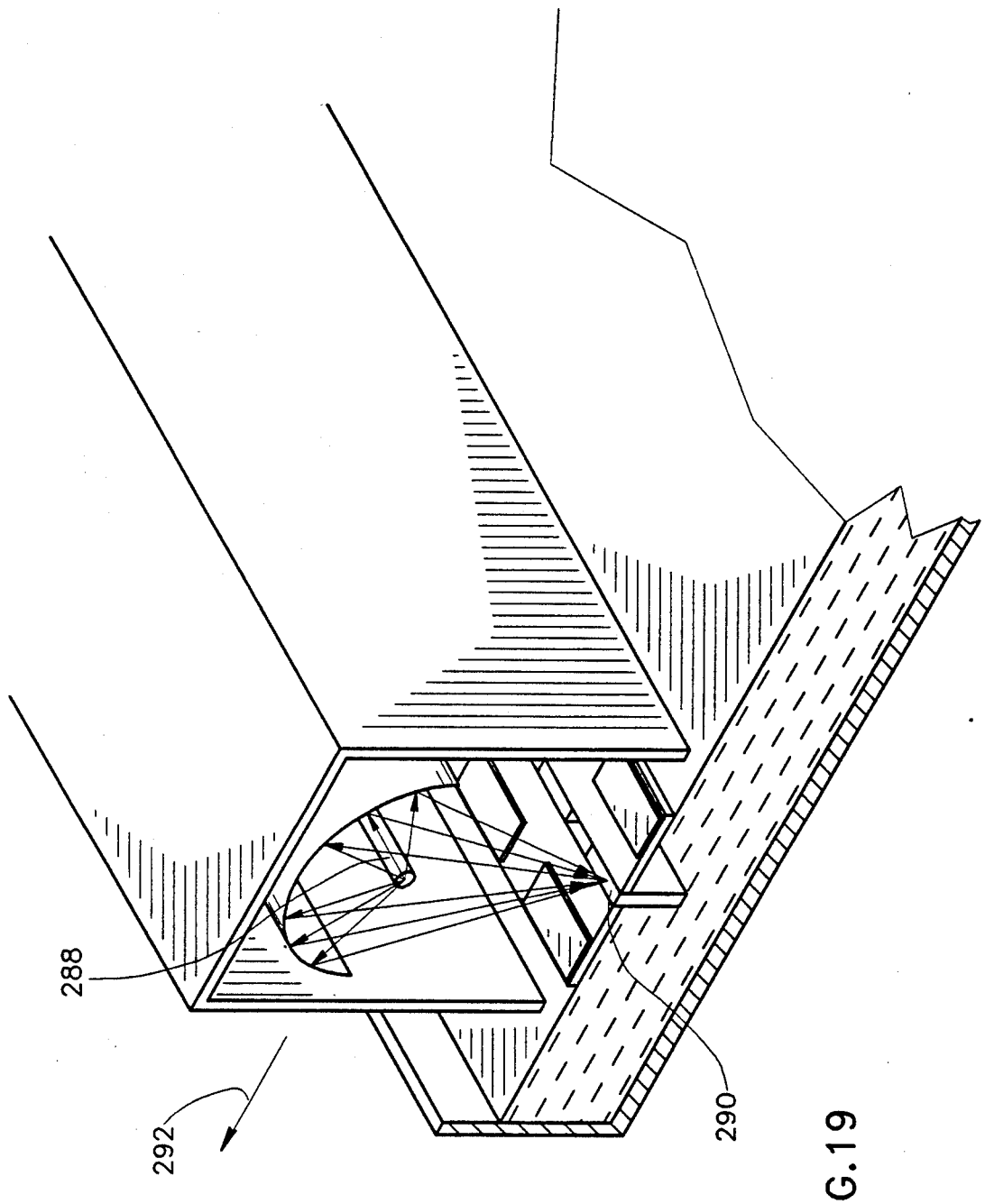
FIG. 19 is a pictorial illustration of apparatus for direct exposure employing an electro-optic shutter, which is useful in a direct exposure modeling device according to the present invention.

Reference is now made to FIG. 19, which illustrates an alternative direct exposure technique suitable for use in the apparatus of FIG. 1A. In the embodiment of FIG. 19, an elongate light source 288 is employed to illuminate a single line of voxels on the solidifiable layer via an electronic line mask 290. The electronic line mask preferably comprises a light switching array of Phillips, Valvo Division. Alternatively, the mask may comprise a liquid crystal array, such as Datashow by Kodak, a PZT electro-optically switched array, or a mechanically operated linear mask.

Both the mask and the light source are translated in a direction 292 across the solidifiable surface, by suitable one dimensional translation apparatus.

A technique employing the apparatus illustrated in FIG. 19 has the advantage that it eliminates mask consumables.

It is appreciated that various small objects can be combined by suitable nesting techniques already discussed above so that they can be formed together in one building up process. Similarly, a large object may be broken down into components, each of which may be made by the techniques described hereinabove.

Figure 20:
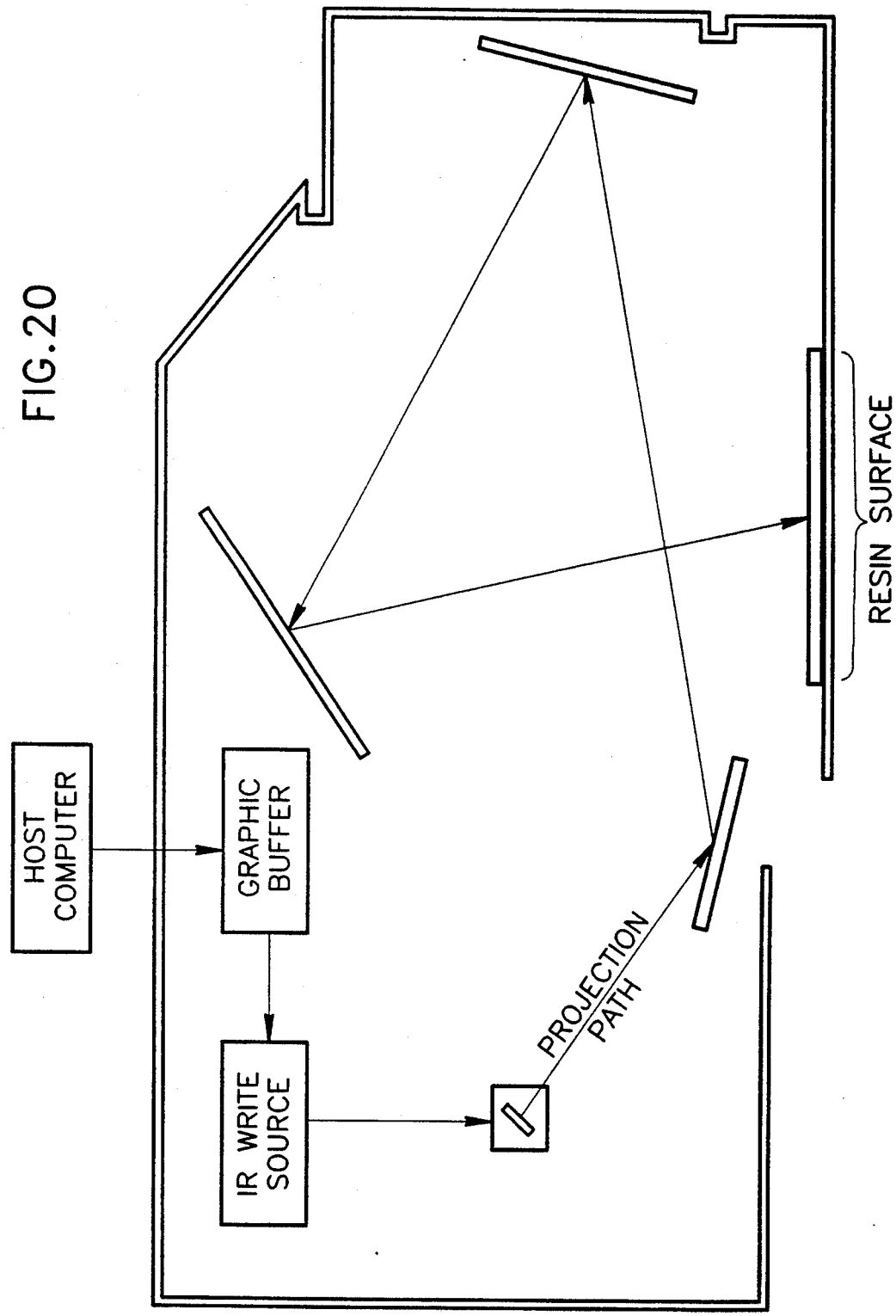
FIG. 20 is a schematic representation of an imaging system employing a partially reflective mirror which is useful in the present invention.

According to an alternative embodiment of the present invention, desired projection of UV light may be achieved by using a special mirror whose reflectance can be modulated such that parts of its are reflective, while other parts are not. Such a reflective system can be found in a Softplot 1221 Large Area Information Monochrome Display available from Greyhawk systems, Inc. of Milpitas, Calif., U.S.A. A preferred configuration of projection apparatus is shown in FIG. 20.

Figure 21:
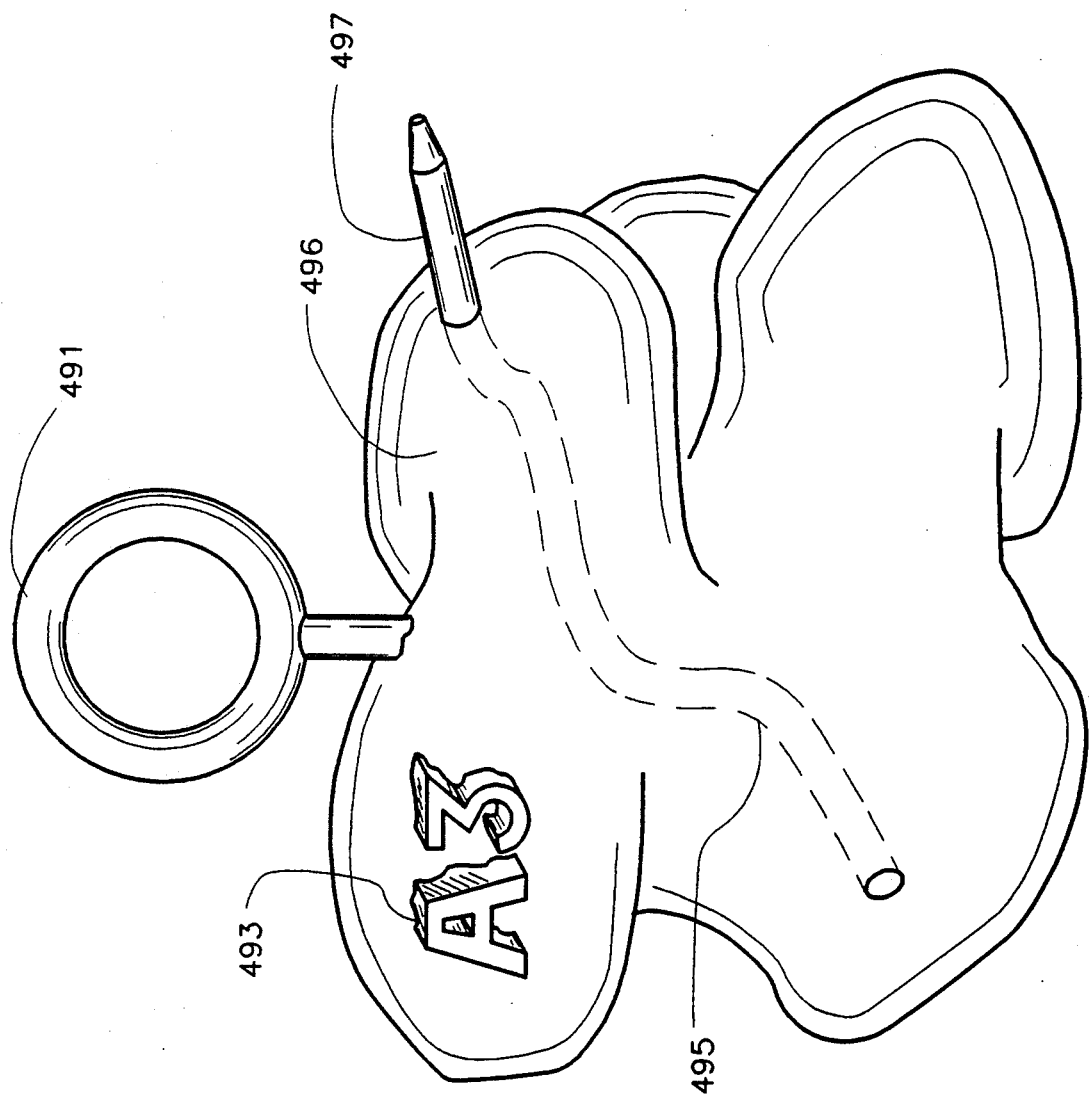
FIG. 21 is a pictorial illustration of a three-dimensional model associated with utility elements in accordance with an embodiment of the invention.

Reference is now made to FIG. 21 which illustrates the association of utility elements to generated three dimensional physical models. Such elements may include a hanger 491 and indicia 493. Additionally an internal communication conduit 495 may be formed within a physical model 496. The model may be integrally formed with a removable external communication port 497 for attachment of an external device to conduit 495, such as for drainage of support material from an internal cavity in the model. Once the port 497 is no longer needed, it may readily be separated from the model. The same is true for elements 491 and 493. The geometrical definition of the utility elements is preferably stored in an appropriate library located in a computer memory such that the elements can readily be called up and, scaled and oriented onto the model as desired.

In accordance with a preferred embodiment of the invention, the techniques and apparatus described herein may be employed in a negative mode in order to provide a model made out of support material which is surrounded by a relatively thin shell of solidified solidifiable material. This model can be readily employed as a pattern for investment casting of metals or other materials.

Figure 22:
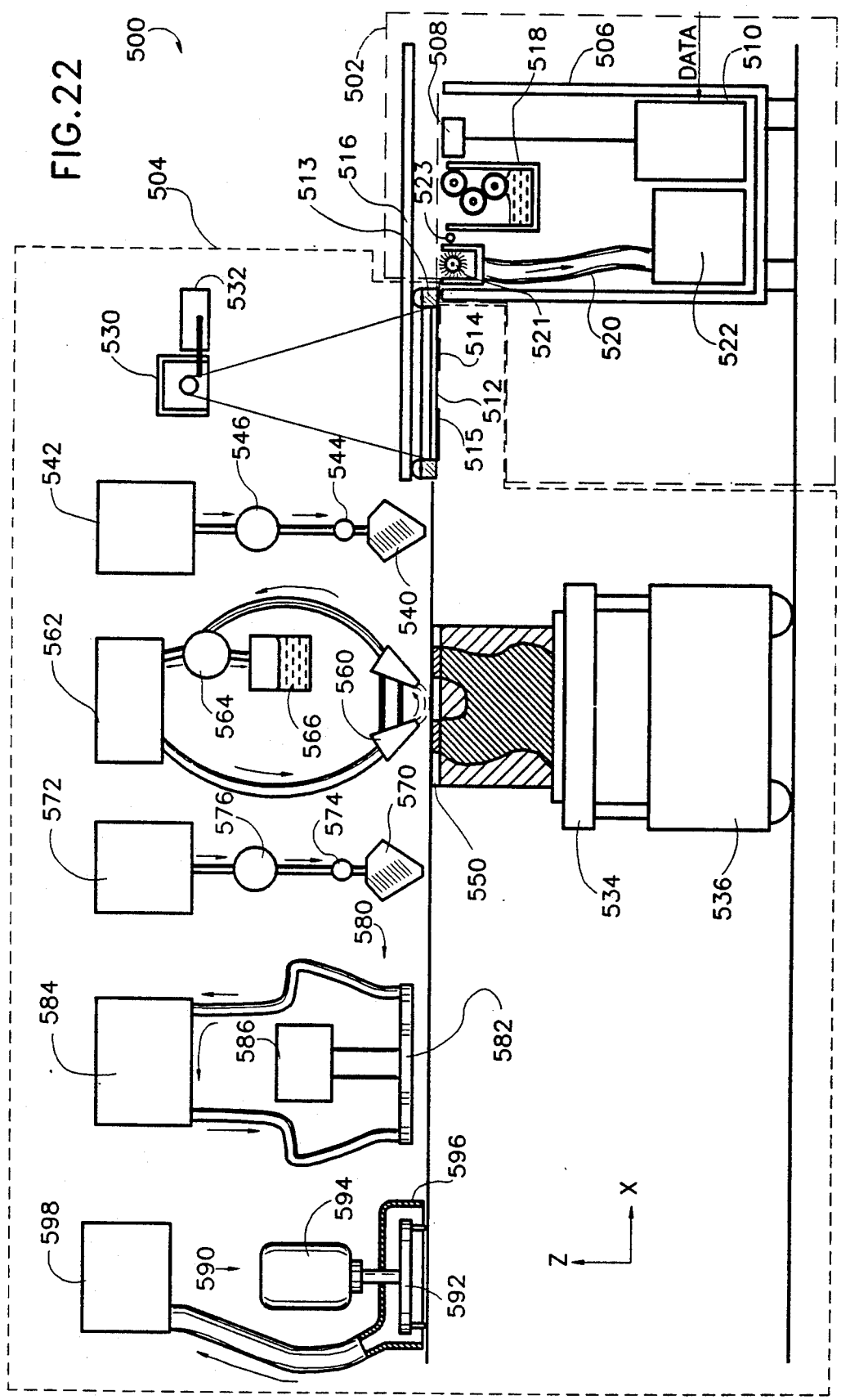
FIG. 22 is a generalized illustration of a three-dimensional modeling system constructed and operative in accordance with a preferred embodiment of the present invention.

Reference is now made to FIG. 22, which illustrates a preferred embodiment of the system and method of the present invention and effectively summarizes many of the teachings which appear hereinabove.

FIG. 22 illustrates a system 500 for producing three dimensional physical models which includes two basic subsystems, a mask producing subsystem 502 and a physical model producing subsystem 504. The mask producing subsystem preferably comprises ionographic imaging apparatus 506, including an ionographic writing head 508, such as a writing cartridge incorporated in a model 2460 graphic engine found in a model S6000 printer, commercially available from Delphax Systems Corp. of Toronto, Canada.

Writing head 508 comprises an array of ion guns which produce a stream of ions in response to received control currents which are provided by a graphic engine 510, such as the 2460 graphic engine mentioned above. Graphic engine 510 is operative to convert graphic data received in a conventional graphic format to the control currents.

Writing head 508 writes onto a transparent dielectric surface 512 which coats a transparent conductive surface which is formed on the underside of a transparent substrate 514, typically formed of glass. The substrate 514 is typically supported on a carriage 513 which travels along a linear guide 516 transversely to writing head 508, which remains stationary. The conductive surface and the dielectric surface are preferably embodied in a commercially available film sold by Hanita Coatings of Hanita, Israel, and designated by Model No. HA 01215.

After ion deposition at writing head 508, the substrate 514 moves into operative engagement with a developing unit 518, such as the developing unit incorporated as part of the aforementioned Model 2460 graphic engine. The developing unit 518 is operative to deposit toner onto the ionized portions of the substrate 514 thereby generating a mask 515.

The mask producing subsystem 502 also comprises substrate cleaning and toner removal apparatus 520 which removes the mask from the substrate after use. Apparatus 520 may include and a brushing unit 521 and a vacuum unit 522. A corona discharge device 523 electrically discharges the substrate after toner removal. Alternatively, the toner may be removed magnetically even by a roller employed as part of the developing unit.

Following the developing of the latent ionographic image on the substrate 514, the substrate 514 leaves the mask producing subsystem 502 and is transported to the physical model producing subsystem 504.

In the physical model producing subsystem 504, the mask bearing substrate is precisely positioned in operative engagement with an exposure unit 530, typically comprising a Model AEL1B UV light source, available from Fusion UV Curing Systems of Rockville, Md. U.S.A. A mechanical shutter 532 controls the exposure.

The three dimensional model is built up layer by layer on a model support surface 534 which can be selectably positioned along the X and Z axes by suitable conventional positioning apparatus 536. Initially the model support surface 534 is located in operative engagement with and under a resin applicator 540, such as a device identified by Part No. PN-650716 found in SNAH 88 of Nordson Corporation, Atlanta, Ga.

Applicator 540 receives a supply of resin from a reservoir 542 via a valve 544 and a supply pump 546 and is operative to provide a layer 550 of resin onto support surface 534 which layer is of generally uniform thickness, typically 0.15 mm. Following application of a resin layer thereto, the surface 534 is positioned in operative engagement with, and under exposure unit 530, such that the mask formed on substrate 514 lies intermediate the light source and the layer 550 in proximity to layer 550 for proximity exposure as described above in connection with FIG. 1C. The shutter 532 is opened for an appropriate duration, typically 5 seconds, thus permitting exposure of the layer 550 through the mask 515 and consequent hardening of the exposed regions of the layer 550. The shutter is then closed.

The mask 515 together with its substrate 514 is returned to the mask producing subsystem 502 for cleaning and preparation of a subsequent mask. In order to eliminate possible defects in the structure of the model due to inherent defects in the transmissivity of the substrate, such as the presence of air bubbles, cracks scratches therein, the orientation of the substrate with respect to the ionographic imaging apparatus may be randomly varied for subsequent layers by changing the relative position of the latent image 515 on the substrate 514 and precisely compensating for such variations at the exposure unit 530, in order to preserve the registration of the layers of the model. Accordingly, the resulting defects do not occur at the same location in each subsequent layer and thus their effect is negligible.

While a subsequent mask is being produced, the model generation process continues: the exposed layer 550 is positioned in operative engagement with a fluid strip generator 560 for removal of unhardened resin from layer 550, as described hereinabove in connection with FIG. 11. The generator 560 communicates with a "push-pull" fluid circulator 562, which may comprise one or more pumps to provide desired positive and negative pressures. Generator 560 also communicates with a separator 564 which separates non-solidified solidifiable material from the fluid stream and directs it to a reclamation reservoir 566.

The thus cleaned layer 550 is then transported into operative engagement with a support material applicator unit 570 and associated reservoir 572, valve 574 and pump 576, which may be similar in construction and operation to units 540, 542, 544 and 546 but provide a support material to fill in those regions in layer 550 from which the unsolidified solidifiable material was removed. Preferably the support material comprises a melted wax of a type mentioned hereinabove. Unit 570 provides a generally uniform top surface to layer 550.

After application of the melted wax to layer 550, the layer is preferably transported into operative engagement with a cooling unit 580, typically comprising a cooled plate 582, such as a block of aluminum furnished with internal channels for the passage of a coolant fluid in communication with a cooled coolant fluid supply 584, such as a Model Coolflow CFT-33 commercially available from NESLAB Instruments Inc., Portsmouth, N.H. U.S.A.. Plate 582 is positioned as desired by a positioning mechanism 586. The wax in layer 550 is cooled by intimate contact with cooled plate 582 in order to solidify it as quickly as possible prior to further processing, as will be described hereinbelow.

Following solidification of the wax in layer 550, the layer is transported into operative engagement with a machining unit 590, typically comprising a conventional multi-blade fly cutter 592 driven by a motor 594 and associated with a dust collection hood 596 and vacuum cleaner 598. Machining unit 590 is operative to trim the top surface of layer 550 to a precise, flat uniform thickness by removing, as appropriate, excessive thicknesses of both the solidified solidifiable material and the solidified support material.

It will be appreciated that the operation of the system for a single layer as described above is repeated multiple times, as the support surface 534 is lowered correspondingly, producing a multilayer built up model having precisely controlled dimensions.

It will be appreciated by persons skilled in the art that the present invention is not limited by what has been particularly shown and described hereinabove. Rather the scope of the present invention is defined only by the claims which follow:

We claim:

1. A system for automatically providing a three-dimensional physical model of a desired geometry and comprising:
   a selectably solidifiable material which solidifies when a given stimulation is applied thereto;
   means for generating said given stimulation in response to input data representing the three-dimensional configuration of said physical model; and
   means for selectably solidifying some portions of the solidifiable material on a sequential layer by layer basis, thereby defining solidified and non-solidified portions of each layer of the solidifiable material, the means for selectably solidifying being characterized in that following selectable solidification of said layer, the non-solidified portions thereof are replaced by a removable support material which is not solidifiable in response to the given stimulation.

2. A system according to claim 1 and wherein said solidifiable material comprises an active resin having a given shrinkage coefficient mixed with a second resin having a given expansion coefficient in order to provide a mixture which has a zero or near zero shrinkage coefficient.

3. A system according to claim 1 and also comprising:
   means for providing coordinate information with respect to a three-dimensional element;
   means arranged to receive the coordinate information from the providing means and manipulate the coordinate information so as to adapt it for use in three-dimensional modeling.

4. A system according to claim 3 and also comprising means for selectably associating stored shapes with said three dimensional model.

5. A system according to claim 1 and wherein said support material is removable from said physical model without damaging the shape thereof or requiring disassembly thereof.

6. A system according to claim 1 and comprising a mirror whose reflectance can be modulated in accordance with the coordinate information such that parts of the mirror are reflective, while other parts are not, thereby providing selectable illumination of said solidifiable material.

7. A system according to claim 1 and also comprising means for removing unsolidified solidifiable material comprising means for applying a solvent to the unsolidified solidifiable material, means for mixing the solvent with the unsolidified solidifiable material and means for suctioning the thus-dissolved unsolidified solidifiable material.

8. A system according to claim 7 and also comprising means for solidifying residual unsolidified solidifiable material.

9. A system according to claim 1 and also comprising means for mechanically machining the layers building up the physical model.

10. A system according to claim 1 and wherein said means for selectably solidifying comprises:
    means for applying a solidifiable liquid onto a support in layers; and
    means for irradiating said solidifiable liquid at a solidification plane defined therein, said means for irradiating including means for irradiating said solidifiable liquid through multiple masks.

11. A system according to claim 1 and also comprising means for providing said removable support material in a melted state and means for subsequently cooling said support material for accelerating the hardening thereof.

12. A system according to claim 1 and comprising fluid strip generating means for removal of non-solidified solidifiable material from said layer, thereby permitting reclamation of said non-solidified solidifiable material.

13. A system according to claim 1 and wherein at least a portion of said removable support material is removed as a solid unit.

14. A system according to claim 1 wherein the given stimulation comprises ultraviolet radiation.

15. A method for automatically providing a three-dimensional physical model of a desired geometry and comprising the steps of:
    providing a solidifiable material which solidifies when given stimulation is provided; and
    selectably solidifying the solidifiable material on a sequential layer by layer basis, the step of selectably solidifying comprising the step of performing the following steps a plurality of times:
    selectably solidifying an individual layer, thereby defining colidified portions of the individual layer and non-solidified portions of the individual layer; and
    removing the non-solidified portions of the individual layer and replacing the non-solidified portions by a removable support material which is not solidifiable in response to the given stimulation.

16. A method according to claim 15 and wherein the step of selectably solidifying an individual layer comprises the step of irradiation of solidifiable material in a pattern such that as shrinkage occurs and additional solidifiable liquid moves into place to take up the shrinkage and is solidified, uniform thickness of the entire solidified portion of the solidifiable liquid layer is maintained.

17. A method according to claim 15 and wherein the step of selectably solidifying comprises the steps of irradiation of solidifiable material sequentially in complementary patterns.

18. A method according to claim 15 and also comprising the step of removing said support material by melting it.

19. A method according to claim 15 and also comprising the step of removing said support material by application thereto of a solvent.

20. A method according to claim 15 and also comprising the steps of generating a fluid strip in operative association with said layer for removal of non-solidified solidifiable material therefrom, thereby permitting reclamation of said non-solidified solidifiable material.

21. A method according to claim 15 wherein the given stimulation comprises ultraviolet radiation.

22. A method of automatically providing a three-dimensional physical model of a desired geometry and comprising the steps of:
  receiving coordinate information;
  producing a plurality of masks on a reusable substrate in accordance with the coordinate information;
  after producing each said mask, sequentially irradiating a layer of a solidifiable liquid via the mask; and
  for each said layer, replacing the non-solidified portions by a removable support material which is not solidifiable in response to the radiating.

23. A method according to claim 22 and also comprising the step of exposure of the plurality of layers through an individual one of the plurality of masks in a line-by-line manner.

24. A method according to claim 22 and wherein the step of producing a plurality of masks comprises the step of writing each individual one of the plurality of masks directly onto the surface of the solidifiable liquid.

25. A method according to claim 22 and wherein said step of sequentially irradiating comprises the step of selecting the optical geometry to at least partially compensate for overflow of material used in generating the mask, by deliberately enlarging a light source employed in said irradiating step to enlarge the areas of said layer exposed through said mask.

26. A system for automatically providing a three-dimensional physical model of a desired geometry and comprising:
  means for selectably solidifying a solidifiable material on a sequential layer by layer basis, the solidifiable material being solidifiable in response to a given stimulation, the means for selectably solidifying comprising at least one of each of the following elements:
    selectably solidifying apparatus for selectably solidifying some portions of an individual layer, thereby defining solidified and non-solidified portions thereof; and
    means for removing the non-solidified portions of the individual layer and for replacing the non-solidified portions by a removable support material which is not solidifiable in response to said given stimulation.

27. A system according to claim 26 wherein the given stimulation comprises ultraviolet radiation.

* * * * *